(12) United States Patent
Seol et al.

(10) Patent No.: US 9,411,679 B2
(45) Date of Patent: Aug. 9, 2016

(54) CODE MODULATION ENCODER AND DECODER, MEMORY CONTROLLER INCLUDING THEM, AND FLASH MEMORY SYSTEM

(71) Applicant: SAMSUNG ELECTRONICS CO., LTD., Suwon-si, Gyeonggi-do (KR)

(72) Inventors: Changkyu Seol, Gyeonggi-do (KR); Junjin Kong, Gyeonggi-do (KR); Hong Rak Son, Gyeonggi-do (KR); Younggeon Yoo, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 521 days.

(21) Appl. No.: 13/834,010

(22) Filed: Mar. 15, 2013

(65) Prior Publication Data

US 2013/0318420 A1  Nov. 28, 2013

(30) Foreign Application Priority Data

May 22, 2012  (KR) .......................... 10-2012-0054331

(51) Int. Cl.
*G11C 29/00* (2006.01)
*H03M 11/00* (2006.01)
*G06F 11/00* (2006.01)
(Continued)

(52) U.S. Cl.
CPC ........ *G06F 11/1008* (2013.01); *G06F 11/1044* (2013.01); *G06F 11/1072* (2013.01); *G06F 12/0246* (2013.01); *G11C 11/5642* (2013.01); *G11C 16/26* (2013.01);
(Continued)

(58) Field of Classification Search
CPC ........... G06F 11/1068; G06F 11/1666; G06F 11/1072; G11C 2211/562; G11C 11/56; G11C 29/00; G11C 11/5642; G11C 16/26
USPC ........ 714/773, 757, 758, 801, 804, 752, 763, 714/820, 701
See application file for complete search history.

(56) References Cited

U.S. PATENT DOCUMENTS 5,263,051 A   11/1993  Eyuboglu
6,279,133 B1   8/2001  Vafai et al.
(Continued)

FOREIGN PATENT DOCUMENTS

KR      100822030        4/2008
KR     20090099757       9/2009
(Continued)

OTHER PUBLICATIONS

G. Ungerboeck, "Trellis-coded modulation with redundant signal sets Part I: Introduction," IEEE Communications Magazine, vol. 25, No. 2, pp. 5-11, 1987.
(Continued)

*Primary Examiner* — Christine Tu
(74) *Attorney, Agent, or Firm* — F. Chau & Associates, LLC

(57) ABSTRACT

Disclosed is a bit-state mapping method of a flash memory system which maps m-bit data (m being a natural number more than 2) onto one of $2^m$ states (voltage threshold distributions). The bit-state mapping method includes performing a subset partitioning operation during first to (m−1)th levels under a condition that two adjacent states are processed as one state; and distinguishing between the adjacent states while processing an (m)th level.

11 Claims, 23 Drawing Sheets

(51) Int. Cl.
 *G06F 11/10* (2006.01)
 *G06F 12/02* (2006.01)
 *G11C 16/26* (2006.01)
 *G11C 11/56* (2006.01)
 *H01L 27/115* (2006.01)

(52) U.S. Cl.
 CPC ...... *H01L 27/1157* (2013.01); *H01L 27/11524* (2013.01); *H01L 27/11556* (2013.01); *H01L 27/11582* (2013.01)

(56) References Cited

U.S. PATENT DOCUMENTS

| | | | |
|---|---|---|---|
| 6,785,860 B1 | 8/2004 | Patti | |
| 6,990,623 B2 | 1/2006 | Furukawa | |
| 7,243,277 B2 | 7/2007 | Wu et al. | |
| 7,805,663 B2 | 9/2010 | Brandman et al. | |
| 7,904,780 B2 * | 3/2011 | Brandman | G06F 11/1068 |
| | | | 714/752 |
| 7,962,831 B2 | 6/2011 | Park et al. | |
| 8,042,027 B1 * | 10/2011 | Burd | H03M 13/251 |
| | | | 375/241 |
| 8,856,622 B2 * | 10/2014 | Ramamoorthy | G06F 11/1068 |
| | | | 365/185.02 |
| 2008/0109702 A1 | 5/2008 | Brandman | |
| 2008/0151621 A1 | 6/2008 | Kong et al. | |
| 2009/0241008 A1 | 9/2009 | Kim et al. | |
| 2010/0315157 A1 | 12/2010 | Na et al. | |

FOREIGN PATENT DOCUMENTS

| | | |
|---|---|---|
| KR | 20100095938 | 9/2010 |
| KR | 20100135062 | 12/2010 |

OTHER PUBLICATIONS

G. Ungerboeck, "Trellis-coded modulation with redundant signal sets Part II: State of the art," IEEE Communications Magazine, vol. 25, No. 2, pp. 12-21, 1987.

* cited by examiner

Fig. 10

Original Data: | 1 0 1 1 0 1 | 1 1 0 1 0 1 1 1 | 0 0 1 0 1 1 | (20 bits)

Bit Divider: MSG1 | 1 0 1 1 0 1 | (K1)
(110) MSG2 | 1 1 0 1 0 1 1 1 | (K2)
MSG3 | 0 0 1 0 1 1 | (K3)

ECC Encoder: CW1 | 1 0 1 1 0 1 1 1 0 | (K1+P1)
(120) CW2 | 1 1 0 1 0 1 1 1 1 | (K2+P2)
CW3 | 0 0 1 0 1 1 0 0 1 | (K3+P3)

State Selector: State P1 P3 P4 P6 P7 E0 P1 P5 P2
(140)

| Level | E0 | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| 1 | 1 | 1 | 0 | 0 | 1 | 1 | 0 | 0 | 1 | 1 | 0 | 0 | 1 | 1 | 0 | 0 |
| 2 | 1 | 1 | 1 | 1 | 0 | 0 | 0 | 0 | 1 | 1 | 1 | 1 | 0 | 0 | 0 | 0 |
| 3 | 1 | 1 | 1 | 1 | 1 | 1 | 1 | 1 | 0 | 0 | 0 | 0 | 0 | 0 | 0 | 0 |
| 4 | 1 | 0 | 1 | 0 | 1 | 0 | 1 | 0 | 1 | 0 | 1 | 0 | 1 | 0 | 1 | 0 |

CODE MODULATION ENCODER AND DECODER, MEMORY CONTROLLER INCLUDING THEM, AND FLASH MEMORY SYSTEM

CROSS-REFERENCE TO RELATED APPLICATIONS

A claim for priority under 35 U.S.C. §119 is made to Korean Patent Application No. 10-2012-0054331 filed May 22, 2012, in the Korean Intellectual Property Office, the entire contents of which are hereby incorporated by reference.

TECHNICAL FIELD

The inventive concept described herein relates to a semiconductor memory device, and more particularly, relate to a flash memory system and a code modulation encoding or decoding method thereof.

DISCUSSION OF THE RELATED ART

In general, semiconductor memory devices include volatile memories such as DRAM, SRAM, and the like and nonvolatile memories such as EEPROM, FRAM, PRAM, MRAM, flash memory, and the like. While the volatile memories lose the contents stored therein at power-off, the nonvolatile memories retain the contents stored therein even at power-off. The flash memory has such benefits as a rapid read speed, low power consumption, a large storage capacity, and the like. For this reason, flash memory based memory systems (hereinafter, referred to as a flash memory system) are widely used as a data storage medium.

A flash memory system may use code modulation schemes to improve the reliability of data. With use of a code modulation scheme, the reliability of data may be improved through an error correction code and signal mapping. While the reliability of data is improved by the code modulation scheme, the code modulation may cause lowering of write and read speeds, thus resulting in lowering of system performance.

SUMMARY

An aspect of the inventive concept provides a bit-state mapping method of a flash memory system which maps m-bit data (m being a natural number more than 2) onto one of $2^m$ states. The bit-state mapping method includes performing a subset partitioning operation during first to (m−1)th levels under a condition that two adjacent states are processed as one state; and distinguishing between the adjacent states at an (m)th level. During the first to (m−1)th levels, a gap between adjacent states within a subset increases according to an increase in a level.

An aspect of the inventive concept provides a code modulation encoder of a flash memory system comprising a bit divider configured to divide original data into a plurality of messages; an ECC encoder configured to make ECC encoding on the respective messages to output code words associated with the messages; and a subset and state selector configured to perform a bit-state mapping operation in response to the code words from the ECC encoder to output code modulation data.

In exemplary embodiment, the bit divider determines a size of each message in light of the error correction capacity of the ECC encoder. The ECC encoder generates parities such that the code words have the same size.

In exemplary embodiment, the subset and state selector performs the bit-state mapping operation in which m-bit data (m being a natural number more than 2) is mapped onto one of $2^m$ states, a subset partitioning operation being performed during first to (m−1)th levels under a condition that two adjacent states are processed as one state and adjacent states being separated (distinguished) at an (m)th level. During the first to (m−1)th levels, a gap between adjacent states within a subset increases according to an increase in the level.

In exemplary embodiment, the original data is input from a host and the code modulation data is provided to a flash memory. The flash memory is a 3-bit MLC flash memory.

An aspect of the inventive concept provides a code modulation decoder of a flash memory system comprising a data hard detector configured to receive code modulation data stored in an m-bit MLC flash memory and to detect a code word generated at a code modulation encoding operation; an ECC decoder configured to receive the code word to output an error-corrected code word; and a subset detector configured to receive the error-corrected code word to detect a subset for determining a code word of a lower level.

In exemplary embodiment, the data hard detector includes first to (m)th hard detectors, each of which receives the code modulation data bit by bit to detect a corresponding code word. The code modulation decoder further comprises a delay circuit configured to provide the code modulation data to the second to (m)th hard detectors after the code modulation data is provided to the first hard detector and after a time elapses.

In exemplary embodiment, the ECC decoder includes first to (m)th ECC decoders for receiving the first to (m)th code words from the first to (m)th hard detectors, respectively. The first to (m)th ECC decoders remove parities to output first to (m)th messages. The code modulation decoder further comprises a bit collector configured to receive the first to (m)th messages from the first to (m)th ECC decoders to output original data.

In exemplary embodiment, the subset detector includes first to (m−1)th subset detectors which receive first to (m−1)th code words error-corrected via the first to (m−1)th ECC decoders to detect a subset for determining the second to (m)th code words, respectively. The (m−1)th subset detector receives the first to (m−1)th code words error-corrected via the first to (m−1)th ECC decoders. The (m)th hard detector detects the (m)th code word in response to a subset detection result of the (m−1)th subset detector and code modulation data of the m-bit MLC flash memory. The first to (m)th ECC decoders have different sizes according to an error correction capacity.

An aspect of the inventive concept provides memory controller of a flash memory system comprising a code modulation encoder which divides original data into a plurality of messages, generates code words associated with the plurality of messages, performs a bit-state mapping operation in response to the code words, and generates code modulation data including a result of the bit-state mapping operation; and a code modulation decoder which receives the code modulation data stored in an m-bit MLC flash memory to recover the original data.

In exemplary embodiment, the code modulation encoder performs the bit-state mapping operation including performing a subset partitioning operation under a condition that two adjacent states are processed as one state during first to (m−1)th levels and distinguishing between the adjacent states at an (m)th level. During the first to (m−1)th levels, a gap between adjacent states within a subset increases according to an increase in the level.

In exemplary embodiment, the code modulation decoder detects a code word generated at the code modulation encoder, makes error correction on the code word, and detects a subset for determining a code word of a lower level based on the error-corrected code word.

An aspect of the inventive concept provides a data storage device comprising a flash memory configured to store m-bit data at a memory cell; and a memory controller configured to control the flash memory, wherein the memory controller comprises a code modulation encoder which divides original data into a plurality of messages, generates code words associated with the plurality of messages, performs a bit-state mapping operation in response to the code words, and stores code modulation data, including a result of the bit-state mapping operation, in the flash memory; and a code modulation decoder which receives the code modulation data stored in the flash memory to recover the original data.

In exemplary embodiment, the code modulation encoder performs the bit-state mapping operation including performing a subset partitioning operation under a condition that two adjacent states are processed as one state during first to (m−1)th levels and distinguishing between the adjacent states at an (m)th level. During the first to (m−1)th levels, a gap between adjacent states within a subset increases according to an increase in the level.

In exemplary embodiment, the code modulation decoder detects a code word generated at the code modulation encoder, makes error correction on the code word, and detects a subset for determining a code word of a lower level based on the error-corrected code word.

An aspect of the inventive concept provides a flash memory system comprising a data storage device including a flash memory configured to store m-bit data at a memory cell; and a memory controller configured to control the flash memory; and a host connected with the data storage device and configured to control the data storage device. The memory controller performs a code modulation encoding operation including dividing original data into a plurality of messages, generating code words associated with the plurality of messages, performing a bit-state mapping operation in response to the code words, and storing code modulation data, including a result of the bit-state mapping operation, in the flash memory; and a code modulation decoding operation including receiving the code modulation data stored in the flash memory to recover the original data.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 10 is a data flowchart illustrating an example of a bit-state mapping method illustrated in FIG. 8;

DETAILED DESCRIPTION OF EXEMPLARY EMBODIMENTS

A memory system according to an embodiment of the inventive concept uses a novel code modulation scheme to improve the reliability of data. In an exemplary embodiment, the code modulation scheme is a signal processing technique applied to a flash memory system to improve the reliability of data through signal mapping. The term 'signal mapping' means a bit-state mapping operation for mapping a data bit onto a program state.

Below, an exemplary flash memory system using a code modulation scheme will be described. An exemplary method of modulating original data or information bits into code modulation data and a bit-state mapping operation executed at the modulating operation will be described. Also described, is an exemplary decoding method for recovering original data from data programmed at a flash memory.

Figure 1:
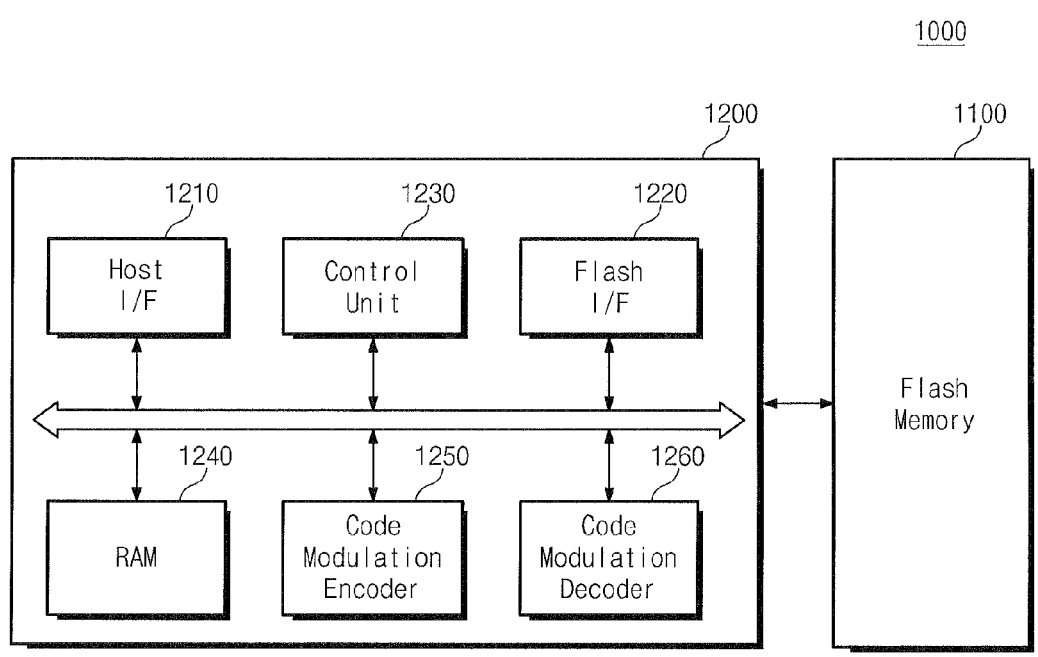
FIG. 1 is a block diagram of a flash memory system according to an embodiment of the inventive concept.

FIG. 1 is a block diagram of a flash memory system according to an embodiment of the inventive concept. Referring to FIG. 1, a flash memory system 1000 includes a flash memory 1100 and a memory controller 1200. The flash memory system 1000 may be any flash memory based data storage device such as a memory card, an USB memory, a solid state drive (SSD), and the like.

The flash memory 1100 can perform an erase operation, write operation, or read operation under the control of the memory controller 1200. The flash memory 1100 includes a plurality of memory blocks, each of which is formed of a plurality of 'pages'. Each 'page' may be formed of a plurality of memory cells connected to one wordline. The flash memory 1100 can perform an erase operation by the memory block (a block erase) and a write or read operation by the page.

A single data bit or two or more data bits (referred to as multi-bit data) may be stored at each memory cell of the flash memory 1100. An SLC flash memory storing single bit data may have an erase state or a program state defined according to a threshold voltage distribution. An MLC flash memory storing multi-bit data may have one of an erase state and more than one program states according to a different threshold voltage distribution. Below, the inventive concept will be described using a 3-bit MLC flash memory. However, the inventive concept is not limited thereto. For example, the inventive concept can be applied to an MLC flash memory which stores two data bits or four or more data bits per memory cell.

The memory controller 1200 controls read operations and write operations of the flash memory 1100 in response to a read request or write request of an external device (e.g., a host). The memory controller 1200 includes a host interface 1210, a flash interface 1220, a control unit 1230, a RAM 1240, a code modulation encoder 1250, and a code modulation decoder 1260.

The host interface 1210 can interfaces with the external device (e.g., a host), and the flash interface 1220 can interfaces with the flash memory 1100. The host interface 1210 can be connected with the host via a parallel ATA bus, a serial ATA bus, an SCSI, an USB, and the like.

The control unit 1230 controls the overall operation of the flash memory 1100 such as reading, writing, file system managing, and the like. For example, although not shown in FIG. 1, the control unit 1230 may include a CPU, a processor, an SRAM, a DMA controller, and the like.

The RAM 1240 may operate responsive to the control of the control logic 1230, and may be used as a work (system) memory, a buffer memory, a cache memory, and the like. The RAM 1240 may be formed of one chip or of a plurality of chips each corresponding to areas of the flash memory 1100.

In the event that the RAM 1240 is used as a work (system) memory, data processed by the control unit 1230 may be temporarily stored at the RAM 1240. When the RAM 1240 is used as a buffer memory, it may be used to buffer data to be transferred from the host to the flash memory 1100 or from the flash memory 1100 to the host. If the RAM 1240 is used as a cache memory (hereinafter, referred to as a cache scheme), it may enable the low-speed flash memory 1100 to operate in high speed. A flash translation layer FTL may be used to manage a merge operation of the flash memory 1100, a mapping table, and the like.

The code modulation encoder 1250 receives original data or information bits to generate an error correction code ECC for correcting error bits. Herein, the error correction code may be referred to as an ECC parameter or parity. The code modulation encoder 1250 makes error correction encoding to generate parity-added data (hereinafter, referred to as a code word). The parity code bits may be stored in the flash memory 1100 with the general (original) data.

The code modulation decoder 1260 can recover original data from code modulation data. The code modulation decoder 1260 can make error correction decoding on data read from the flash memory 1100, and may judge whether the error correction decoding is successful, according to the decoding result. The code modulation decoder 1260 may output an indication signal according to the judgment result, and can correct error bits of data using the parity.

The code modulation encoder 1250 and the code modulation decoder 1260 may be implemented by one module, and may perform an error correction function using LDPC (low density parity check) code, BCH code, turbo code, Reed-Solomon code, convolution code, RSC (recursive systematic code), TCM (trellis-coded modulation), BCM (Block coded modulation), and the like.

The flash memory system 1000 in FIG. 1 can generate code modulation data using the code modulation encoder 1250 and recover original data using the code modulation decoder 1260. The inventive concept may effectively use a system area while maintaining the reliability of data by efficiently designing the code modulation encoder 1250 and the code modulation decoder 1260 according to the error correction capacity of an ECC engine.

Figure 2:
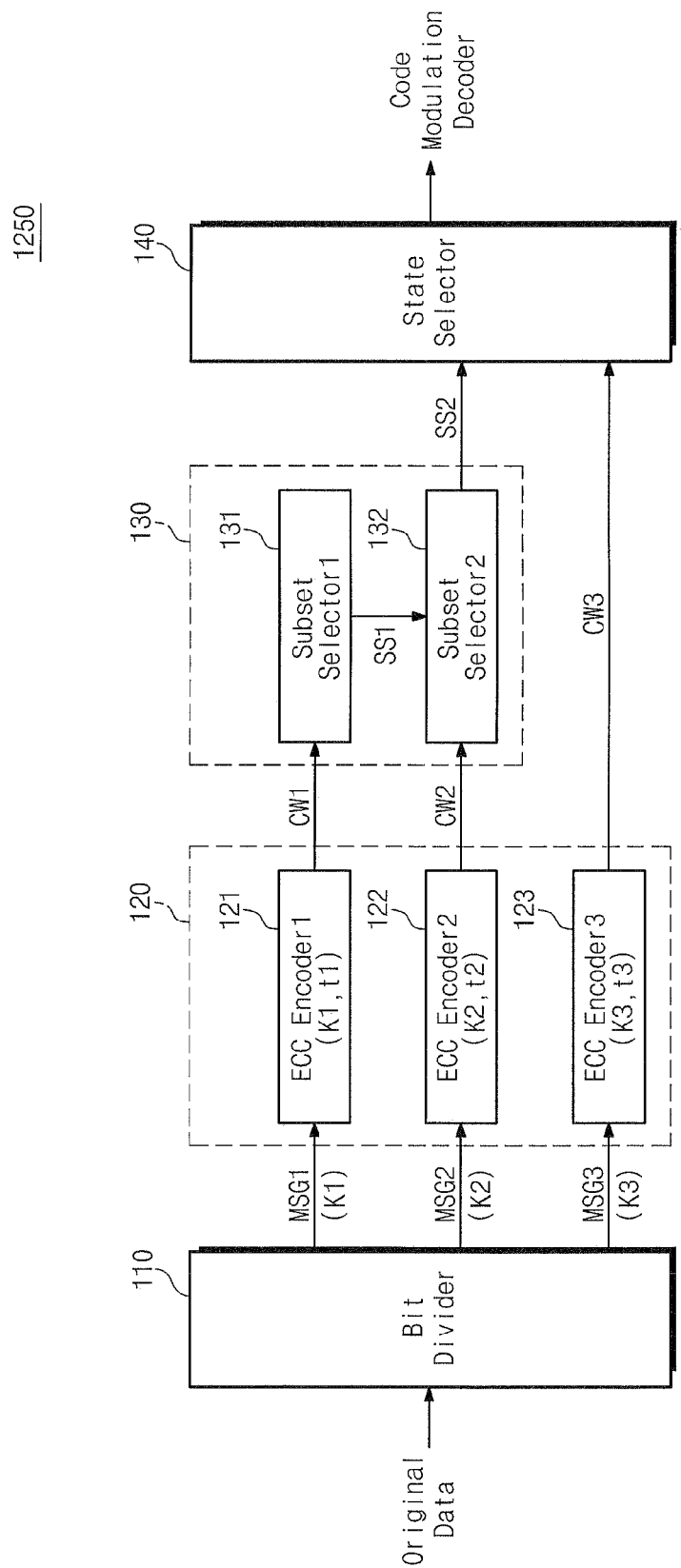
FIG. 2 is a block diagram of the code modulation encoder in flash memory system of FIG. 1.

FIG. 2 is a block diagram of the code modulation encoder in the flash memory system of FIG. 1. The code modulation encoder 1250 in FIG. 2 receives original data to provide a flash memory 1100 with code modulation data having a mapping result between three bits and eight states. In FIG. 2, there is illustrated an example of a 3-bit MLC flash memory.

Referring to FIG. 2, the code modulation encoder 1250 includes a bit divider 110, an ECC encoder 120, a subset selector 130, and a state selector 140. The code modulation encoder 1250 receives original data to output code modulation data.

The bit divider 110 divides the original data into three bit vectors. Herein, a 'bit vector' may be also referred to as a message MSG. Messages may have the same size or different sizes. The size of each message may vary according to an error correction capacity of the ECC encoder 120.

In an exemplary embodiment, original data may be divided into first, second, and third messages MSG1, MSG2, and MSG3. The first message MSG1 may have a size of K1, the second message MSG2 may have a size of K2, and the third message MSG3 may have a size of K3. The first to third messages MSG1 to MSG3 may be provided to the ECC encoder 120.

The ECC encoder 120 can generate code words CW having the same size by adding parities to the first to third messages MSG1 to MSG3, respectively. Note that the code words don't necessarily always have the same size.

The ECC encoder 120 includes first to third ECC encoders 121 to 123. The first to third ECC encoders 121 to 123 may have different error correction capacities. In FIG. 2, t1, t2, and t3 may represent the error correction capacities of the first, second, and third ECC encoders 121, 122, and 123.

The first ECC encoder 121 can be provided with a message of a K1 size and have an error correction capacity of t1. The first ECC encoder 121 can generate a first parity having a p1 size to output a first code word CW1 having a (K1+p1) size. The second ECC encoder 122 can be provided with a message of a K2 size and have an error correction capacity of t2. The second ECC encoder 122 can generate a second parity having a p2 size to output a second code word CW2 having a (K2+p2) size. The third ECC encoder 123 can be provided with a message of a K3 size and have an error correction capacity of t3. The third ECC encoder 123 can generate a third parity having a p3 size to output a third code word CW3 having a (K3+p3) size. Herein, the first to third code words CW1 to CW3 may have the same size.

The subset selector 130 and the state selector 140 are configured to perform a bit-state mapping operation for determining one of eight states in response to the first to third code words CW1 to CW3. Referring to FIG. 2, the subset selector 130 includes first and second subset selectors 131 and 132 over various levels. The subset selector 130 may select a subset according to data input at each level. Herein, the term 'subset' may mean a set of states represented by threshold voltages. For example, a subset may include {E0, P2, P4, P6}, {P1, P3, P5, P7}, {E0, P4}, {P2, P6}, {P1, P5}, {P3, P7}, or the like.

The first subset selector 131 can sequentially receive the first code word CW1 bit by bit to select a first level subset according to an input data bit ('1' or '0'). For example, the first subset selector 131 may select {E0, P2, P4, P6} or {P1, P3, P5, P7} during a first level. The first subset selector 131 can perform an operation for selecting the first level subset by a size of the first code word CW1. The first subset selector 131 may provide first subset selection information SS1 to the second subset selector 132.

The second subset selector 132 can sequentially receive the second code word CW2 bit by bit. The second subset selector 132 can select a second level subset according to the first subset selection information SS1 and the second code word CW2. For example, the second subset selector 132 can select {E0, P4}, {P2, P6}, {P1, P5} or {P3, P7}. The second subset selector 132 can perform an operation for selecting the second level subset by a size of the second code word CW2. The second subset selector 132 can provide second subset selection information SS2 to the state selector 140.

The state selector 140 can sequentially receive the third code word CW3 bit by bit. The state selector 140 selects one of eight states E0 to P7 according to the second subset selection information SS2 and the third code word CW3. The state selector 140 can perform an operation for selecting the state by a size of the third code word CW3. The state selector 140 can provide the flash memory 1100 with code modulation data including bit-state mapping information.

Figure 3:
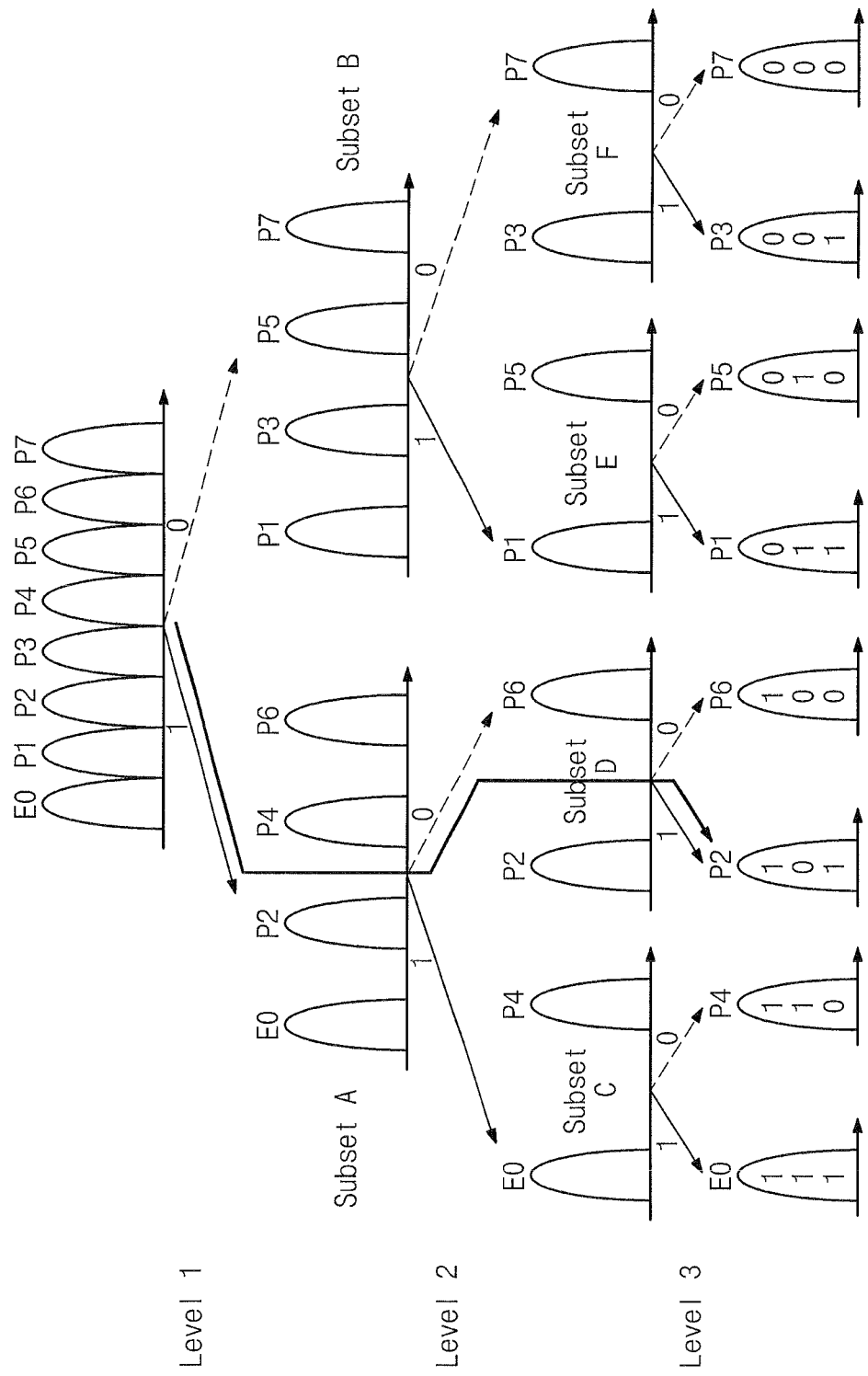
FIGS. 3 and 4 are threshold voltage distribution diagrams illustrating the bit-state mapping method of the code modulation encoder in FIG. 2 and a mapping result thereof.
Figure 4:
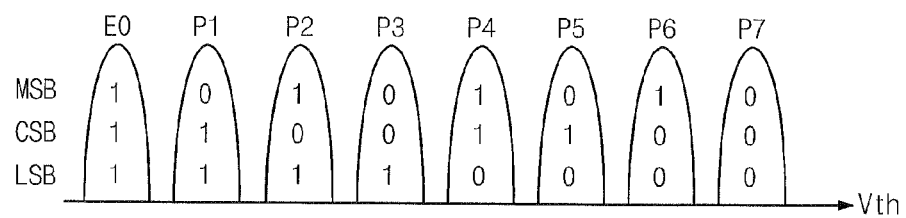

FIGS. 3 and 4 are threshold voltage distribution diagrams illustrating the bit-state mapping method of the code modulation encoder in FIG. 2 and a mapping result thereof. A 3-bit MLC flash memory has eight states E0 to P7, which are divided into lower subsets over plural levels through a set partitioning process.

In FIG. 3, an operation of mapping data of '101' onto any state will be described (refer to the bold solid line path). Herein, MSB data '1' may be data that belongs to a first code word CW1 provided to a first subset selector 131. CSB data '0' may be data that belongs to a second code word CW2 provided to a second subset selector 132. LSB data '1' may be data that belongs to a third code word CW3 provided to a state selector 140. Herein, MSB data may be upper bit data, CSB data may be center bit data, and LSB data may be lower bit data.

During a first level, the first subset selector 131 select a subset A or a subset B according to the MSB data. Herein, the subset A is {E0, P2, P4, P6} and the subset B is {P1, P3, P5, P7}. The subset A is selected when the MSB data has a value of '1' and the subset B is selected when the MSB data has a value of '0'. Since the MSB data has a value of '1' in the current example, the subset A is selected.

During a second level, the second subset selector 132 selects one of subsets C to F according to the CSB data. Herein, the subset C is {E0, P4}, the subset D is {P2, P6}, the subset E is {P1, P5}, and the subset F is {P3, P7}. If the subset A was selected at the first level, then the subset C is selected when the CSB data has a value of '1' and the subset D is selected when the CSB data has a value of '0'. If the subset B was selected at the first level then the subset E i selected when the CSB data has a value of '1' and the subset F is selected when the CSB data has a value of '0'. Since in this example the subset A was selected at the first level and the CSB data has a value of '0', the subset D is selected at the second level.

At a third level, the state selector 140 selects one of the eight states E0 to P7 according to the subset selected at the second level and the LSB data. Since the subset D was selected at the second level and the LSB data has a value of '1', the second program state P2 is selected at the third level. Thus, data '101' is mapped onto the program state P2.

As understood from the above description, 3-bit data may be mapped onto one of the eight states. Referring to FIG. 4, '111', '011', '101', '001', '110', '010', '100', and '000' may be mapped onto E0, P1, P2, P3, P4, P5, P6, and P7, respectively. 3-bit data may have different states according to a bit-state mapping method.

Returning to FIG. 3, as the level increases, the gap between states within each subset may increase. It is assumed that a gap between states at an initial state is d. With this assumption, the gap between states within each subset may be 2d at a first level. At the subset A, the gap between adjacent states among states E0, P2, P4, and P6 is 2d. At the subset B, the gap between adjacent states among states P1, P3, P5, and P7 is 2d. The gap between states within each subset may be 4d at a second level. The gap between states E0 and P4 at the subset C, the gap between states P2 and P6 at the subset D, the gap between states P1 and P5 at the subset E, and the gap between states P3 and P7 at the subset F may be 4d, respectively.

Since the gap between states widens toward the lower level, it is possible to lower the error correction capacity of an ECC encoder. In FIG. 2, the error correction capacity t2 of a second ECC encoder 122 may be less than the error correction capacity t1 of a first ECC encoder 121. The error correction capacity t3 of a third ECC encoder 123 may be less than the error correction capacity t2 of the second ECC encoder 122. With the above-described bit-state mapping method, the reliability of data may be secured and an ECC encoder may be designed more efficiently.

Figure 5:
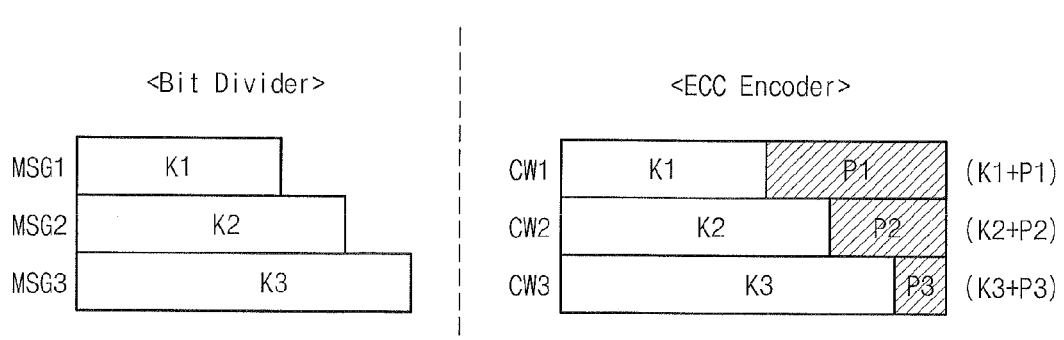
FIG. 5 is a conceptual diagram schematically illustrating an example that an ECC encoder is efficiently designed according to a bit-state mapping method illustrated in FIG. 3.

FIG. 5 is a conceptual diagram schematically illustrating an example that an ECC encoder is efficiently designed according to the bit-state mapping method of FIG. 3. Referring to FIG. 5, a bit divider 110 may divide original data such that a first message MSG1 has the smallest size K1 and a third message MSG3 has the largest size K3, in light of the condition that a gap between states widens toward a lower level. Thus, the bit divider 110 may determine a message size relationship such as K1<K2<K3.

An ECC encoder 120 may be configured such that the first ECC encoder 121 has the highest error correction level (or, capacity) and the third ECC encoder 123 has the lowest error correction level (or, capacity). As described above, a code word may be formed of a message and a parity. Code words may have the same uniform bit size. Thus, the bit size of the first parity P1 may be largest, and the size of the third parity P3 may be smallest. Thus, parity sizes may have such a correlation as P1>P2>P3.

Figure 6:
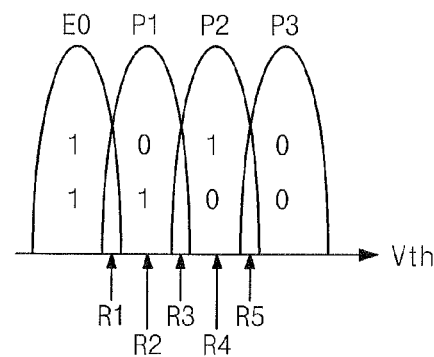
FIGS. 6 and 7 are threshold voltage distribution diagrams illustrating levels for reading data stored in a flash memory according to the bit-state mapping scheme of FIG. 3.
Figure 7:
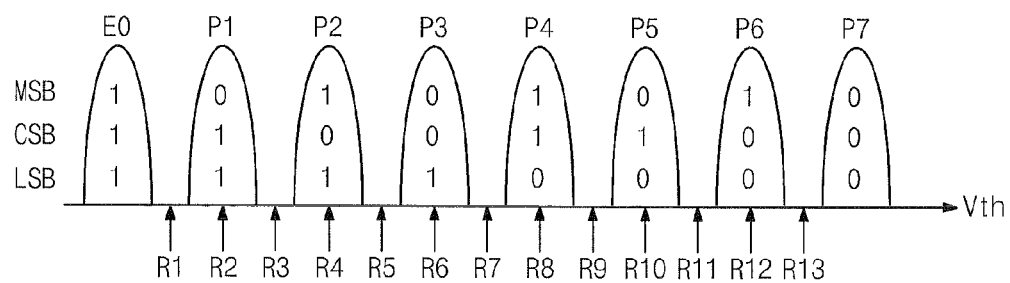

FIGS. 6 and 7 are threshold voltage distribution diagrams illustrating levels for reading data stored in a flash memory according to the bit-state mapping scheme of FIG. 3. FIG. 6 shows an example of a 2-bit MLC flash memory, and FIG. 7 shows an example of a 3-bit MLC flash memory.

Referring to FIG. 6, whether MSB data is '0' or '1' may be determined according to the results of multiple read operations executed using read levels R1, R3, and R5. Whether LSB data is '0' or '1' may be determined according to the MSB data and the results of multiple read operations executed using read levels R2 and R4. In a case where MSB data is determined to be '1', LSB data may be determined according to whether a value read from the flash memory cell corresponds to an erase state E0 or to a program state P2.

A read operation may be additionally executed at the central point (a center of a P1 state) between the centers of E0 state and P2 state to minimize a detection error associated with the E0 and P2 states. Likewise, if MSB data is '1', a read operation may be additionally executed at the central point (a center of a P2 state) between the centers of P1 state and P3 states.

As illustrated in FIG. 6, a flash memory storing 2-bit data at a memory cell performs read operations using read levels R1, R2, R3, R4 and R5 by a word line unit, wherein read levels R2 and R4 are centered as described above to secure the reliability of data. Referring to FIG. 7, in case of a 3-bit MLC flash memory, read operations are performed using 13 read levels R1 to R13, wherein read levels R2, R4, R6, R8, R10, and R12 are centered as described above to secure the reliability of data. Likewise, in case of a 4-bit MLC flash memory, read operations may be performed using 29 read levels, wherein the fourteen even numbered read levels therein are centered as described above to secure the reliability of data.

Figure 8:
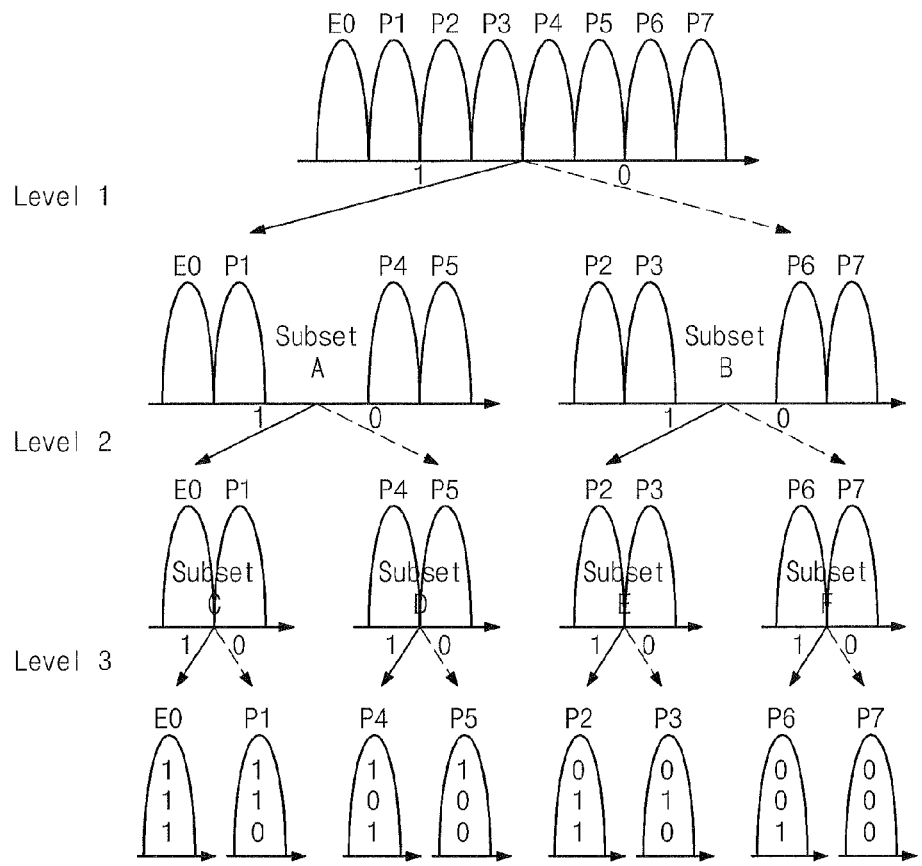
FIGS. 8 and 9 are threshold voltage distribution diagrams illustrating a bit-state mapping method of the code modulation encoder in FIG. 2.
Figure 9:
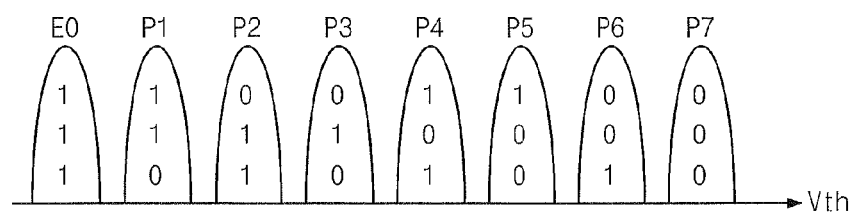

FIGS. 8 and 9 are threshold voltage distribution diagrams illustrating a bit-state mapping method of the code modulation encoder in FIG. 2.

With the bit-state mapping method of FIG. 8, two adjacent states may be processed as one state, and may be separated at the last level. Thus, it is possible to reduce a read number. In case that the bit-state mapping method in FIG. 8 is applied to a 3-bit MLC flash memory, seven read operations may be performed using read levels R1, R3, R5, R7, R9, R11, and R13, respectively.

Referring to FIG. 8, the 3-bit MLC flash memory makes set partitioning over first to third levels. During the first and second levels, two adjacent states may be processed as one state. For example, state pairs E0^P1, P2^P3, P4^P5, and P6^P7 may be processed as one state, respectively. Herein, a symbol "^" indicates that adjacent states are processed as one state (e.g., states (E0 and P1) are processed as one state with the states E0 and P1 being adjacent.)

During the first level, a subset A or a subset B may be determined according to MSB data. Herein, the subset A may be {E0^P1, P4^P5}, and the subset B may be {P2^P3, P6^P7}. The subset A is selected when the MSB data is 1, and the subset B is selected when the MSB data is 0. Herein, each of (E0 and P1), (P4 and P5), (P2 and P3), and (P6 and P7) may be processed as one state, respectively.

During the second level, one of subsets C to F is selected according to the subset determined at the first level and the CSB data. Herein, the subset C is {E0^P1}, the subset D is {P4^P5}, the subset E is {P2^P3}, and the subset F is {P6^P7}. For example, if the subset A is selected at the first level and CSB data is 0, the subset D, {P4^P5}, is selected.

During the third level, the state selector 140 separates adjacent states in a state pair according to the subset selected at the second level and the LSB data. When the subset D is selected at the second level and LSB data is 1, a fourth program state P4 is selected at the third level. Thus, the data value of '101' is mapped onto the fourth program state P4.

Referring to FIG. 9, data values (111), (110), (001), (010), (101), (100), (001), and (000) are mapped onto an E0 state, a P1 state, a P2 state, a P3 state, a P4 state, a P5 state, a P6 state, and a P7 state, respectively. The above bit-state mapping result is different from that illustrated in FIG. 3 and FIG. 4. As described above, data may be represented by different states according to a bit-state mapping method.

In the case of an m-bit MLC flash memory, the bit-state mapping method in FIG. 8 performs set partitioning over m levels. During (m−1) levels, two adjacent states may be processed as one state, which is performed the same as a bit-state mapping method in FIG. 3. At the last (m)th level, adjacent states are separated.

The bit-state mapping method in FIG. 8 can reduce the read number while maintaining the reliability of data. Thus, with the bit-state mapping method of the inventive concept, the number of read operations executed at central points of respective states (e.g., R2, R4, R6, R8, R10, and R12) may be reduced.

In the case of the bit-state mapping method in FIG. 8, the m-th level may provide the smallest average gap among states. Referring to FIG. 8, the gap among states within each subset at the third level may be d which is the smallest among all levels. The bit-state mapping method in FIG. 8 may enable an ECC encoder to be designed efficiently in light of an error correction capacity of each ECC encoder.

For example, the error correction capacity t3 of a third ECC encoder may be larger than the error correction capacity t2 of a second ECC encoder, and the second ECC encoder may be designed to have the smallest error correction capacity. With the bit-state mapping method in FIG. 8, it is possible to reduce the number of read operations and to design an ECC encoder more efficiently.

FIG. 10 is a data flowchart illustrating an example of the bit-state mapping method illustrated in FIG. 8. It is assumed that original data is formed of 20 bits as illustrated in FIG. 10.

A bit divider 110 divides original data into first, second, and third messages MSG1, MSG2, and MSG3 having sizes of K1, K2, and K3 in light of the error correction capacity of an ECC encoder 120. The bit divider 110 determines the size of the third message MSG3 to be smallest in light of the condition that an average gap among states at a third level is narrowest. In an exemplary embodiment, the first message MSG1 may be formed of six bits (101101), the second message MSG2 may be formed of eight bits (11010111), and the third message MSG3 may be formed of six bits (001011).

The ECC encoder 120 may be configured such that the third ECC encoder 123 has the largest error correction capacity and the second ECC encoder 122 has the smallest error correction capacity. The ECC encoder 120 generates parities (parity bits) such that code words have the same size. First to third code words CW1, CW2 and CW3 have the same size (e.g., 9 bits). In this exemplary embodiment, a first parity P1 may be formed of three bits (110), a second parity P2 may be formed of 1 bit (1), and a third parity P3 may be formed of three bits (001).

A subset selector 130 and a state selector 140 receives each code word bit by bit to perform a bit-state mapping operation. For example, the state selector 140 maps input data of (110) onto a P1 state and input data of (010) onto a P3 state as illustrated in FIG. 9. The state selector 140 performs the above operation by a size of a code word (9 bits), and provides a flash memory 1100 with code modulation data including a mapping result.

Figure 11:
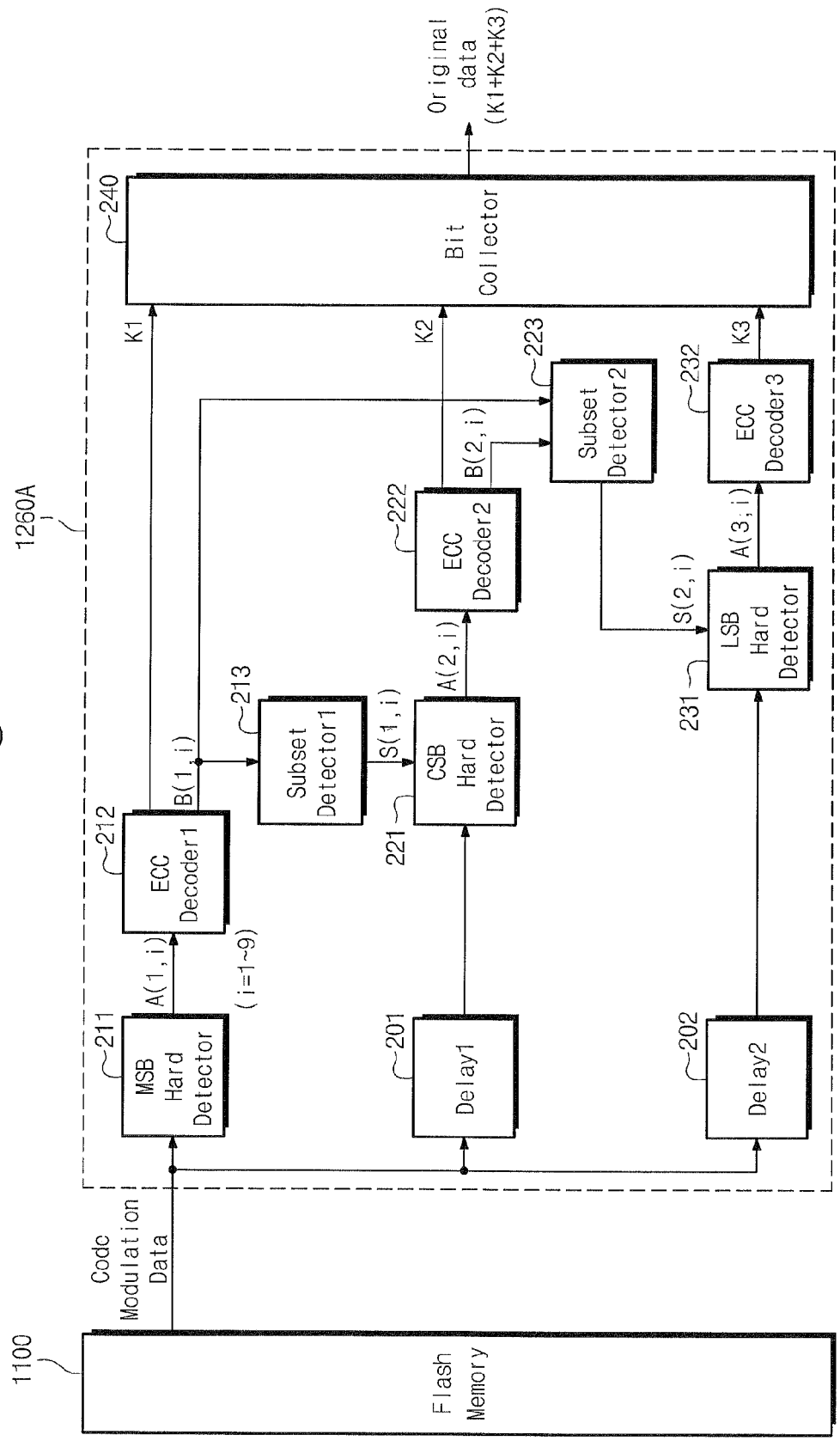
FIG. 11 is a block diagram of an exemplary implementation the code modulation decoder in the flash memory system of FIG. 1.
Figure 12:
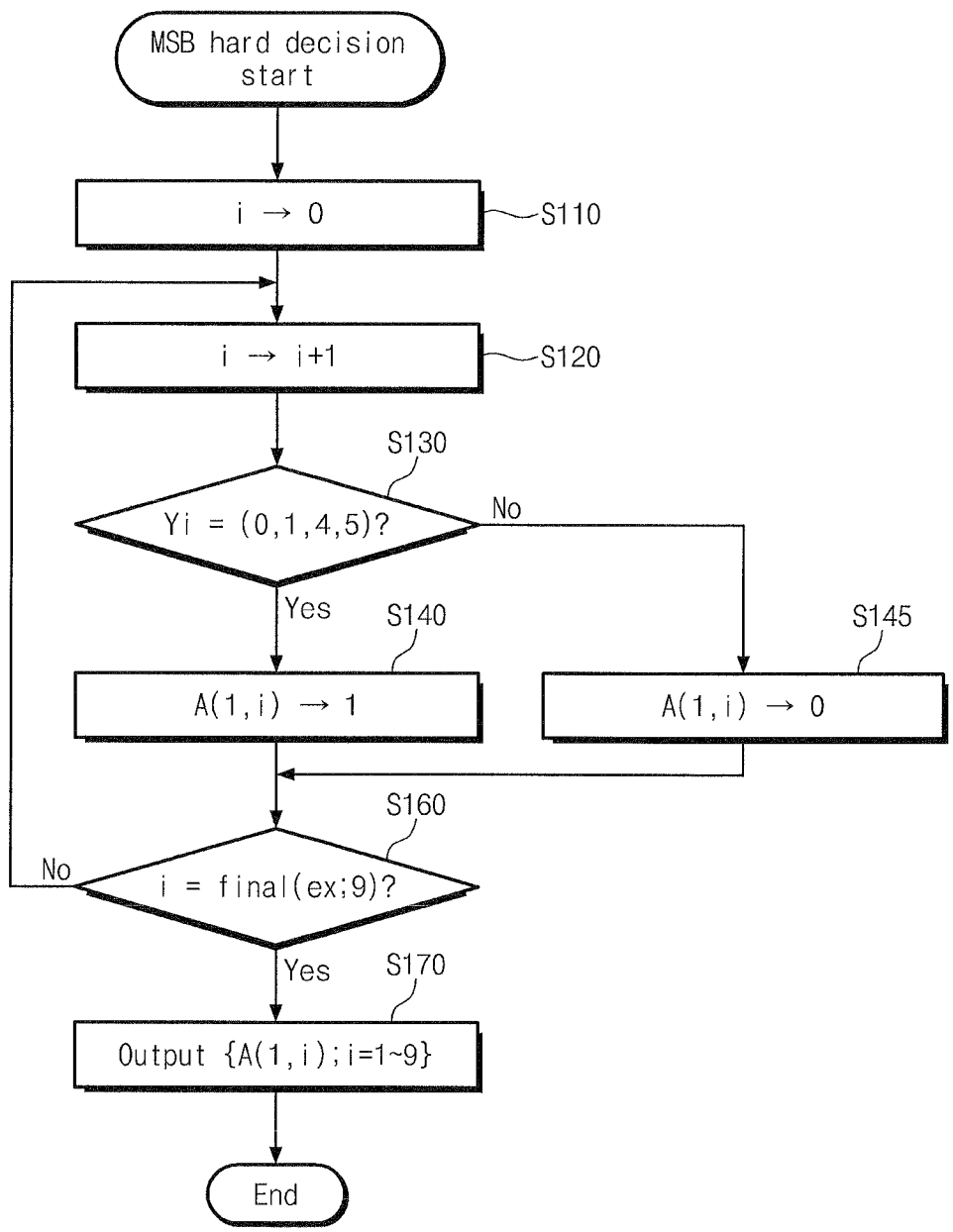
FIG. 12 is a flowchart illustrating an operating method of the MSB hard detector of the code modulation decoder of FIG. 11.
Figure 13:
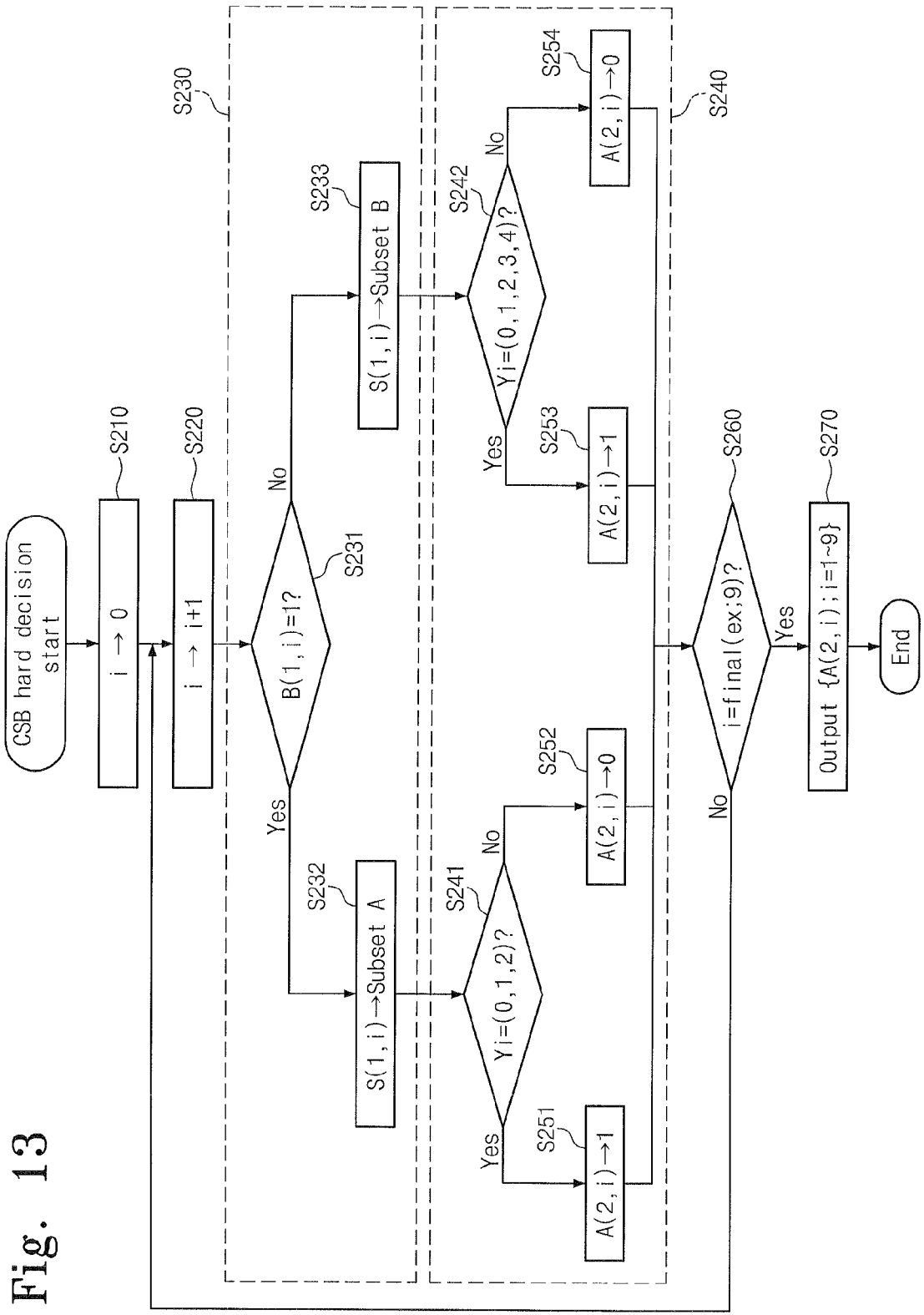
FIG. 13 is a flowchart illustrating an operating method of the first subset detector and the CSB hard detector of the code modulation decoder of FIG. 11.
Figure 14:
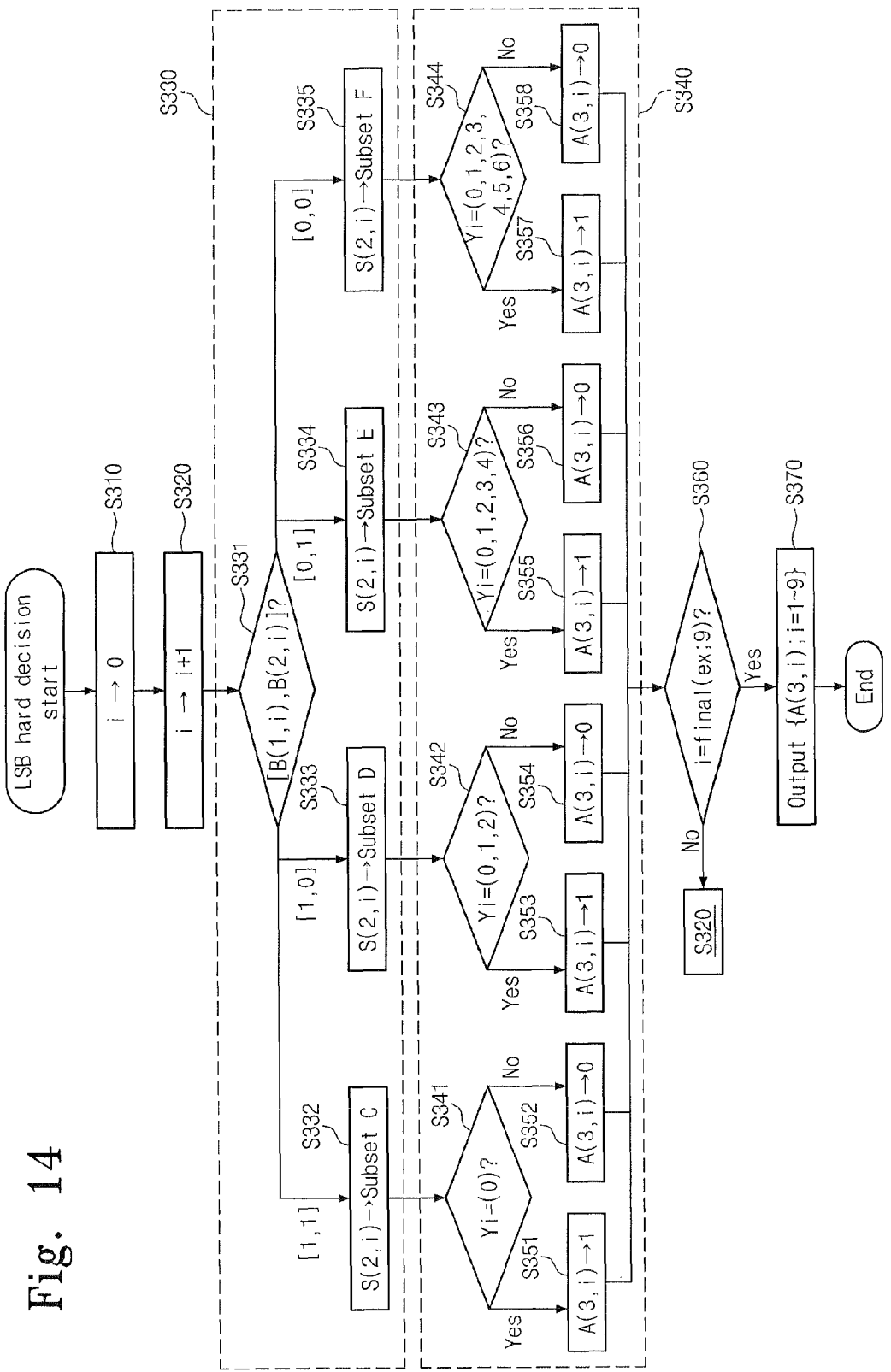
FIG. 14 is a flowchart illustrating an operating method of the second subset detector and an LSB hard detector of the code modulation decoder of FIG. 11.

FIG. 11 is a block diagram of an exemplary implementation 1260A of the code modulation decoder 1260 in the flash memory system of FIG. 1. FIGS. 12 to 14 are flowcharts illustrating the operation methods performed in the code modulation decoder 1260A illustrated in FIG. 11.

The code modulation decoder 1260A recovers original data by decoding code modulation data read from a flash memory 1100. Below, a code modulation decoding method for recovering data code-modulated via the bit-state mapping method illustrated in FIG. 8 will be described. In an example, the method for recovering original data of 20 bits from the code-modulated data (P1P3P4P6P7E0P1P5P2) described in FIG. 10 will be described.

The flash memory 1100 reads data from memory cells (e.g., first to ninth memory cells) by performing seven read operations using seven read levels R1, R3, R5, R7, R9, R11, and R13. The flash memory 1100 provides a code modulation decoder 1260A with code modulation data corresponding to (P1, P3, P4, P6, P7, E0, P1, P5, and P2) read from the memory cells. Below, a read result of the flash memory 1100 (the result of reading MLC memory cells) may be marked by Yi (i=1 to 9). In this example, Yi (i=1 to 9) is 1, 3, 4, 6, 7, 0, 1, 5, and 2.

Referring to FIG. 11, the code modulation decoder 1260A includes delay circuits 201 and 202, data hard detectors 211, 221, and 231, ECC decoders 212, 222, and 232, subset detectors 213 and 223, and a bit collector 240. The delay circuit 201 provides the read result Yi to the CSB hard detector 221 after the read result Yi is provided to the MSB hard detector 211 and after a first delay time elapses. The delay circuit 202 provides the read result Yi to the LSB hard detector 231 after the read result Yi is provided to the MSB hard detector 211 and after a second delay time elapses.

The data hard detectors 211, 221, and 231 include an MSB hard detector 211 for detecting MSB data, a CSB hard detector 221 for detecting CSB data, and an LSB hard detector 231 for detecting LSB data. The MSB hard detector 211 receives the read result Yi of the flash memory 1100 to output MSB data A(1,i).

FIG. 12 is a flowchart illustrating an operating method of the MSB hard detector 211 of the code modulation decoder of FIG. 11. Referring to FIG. 12, in step S110, the index variable i is reset to 0. In step S120, the index variable i is increased (incremented) by one.

In decision step S130 being an MSB data detecting operation, an MSB hard detector 211 judges whether a read result Yi is (0, 1, 4, 5). If a read result Yi is (0, 1, 4, 5) corresponding to the subset A in FIG. 8 (YES branch of S130), then in step S140, the MSB hard detector 211 determines the MSB data to be 1. Thus, A(1,i) is 1. If the read result Yi is not (0, 1, 4, 5) corresponding to a subset A in FIG. 8 (NO branch of S130), then in step S145, the MSB hard detector 211 determines the MSB data to be 0. Thus, A(1,i) is 0.

In decision step S160, whether the variable i is a final value (e.g., 9) is judged. If not (NO branch of S160), the method proceeds back to step S120. If so (YES branch of S160), the method proceeds to step S170, in which the value of {A(1,i); i=1~9} is output. In this example, the MSB hard detector 211 may output A(1,i)={1, 0, 1, 1, 0, 1, 1, 1, 0}.

Returning to FIG. 11, the MSB hard detector 211 outputs MSB data A(1,i) to the first ECC decoder 212. The first ECC decoder 212 can correct an error using a first parity P1 to provide error-corrected data B(1,i) to first and second subset detectors 213 and 223. In the case that MSB data is not erroneous, the first ECC decoder 212 outputs B(1,i)={1, 0, 1, 1, 0, 1, 1, 1, 0} in this example. The first ECC decoder 212 removes the first parity P1 to provide the bit collector 240 with a first message MSG1 having a size of K1. In this example, the first message MSG1 is (1, 0, 1, 1, 0, 1).

The first subset detector 213 sequentially receives B(1,i) from the first ECC decoder 212 to determine a subset according to the data. For example, if input data is 1, the subset A is selected/determined. If input data is 0, the subset B is selected/determined. The first subset detector 213 provides a subset detection result S(1,i) to the CSB hard detector 221. The CSB hard detector 221 outputs CSB data according to the read result Yi of the flash memory 1100 and the subset detection result S(1,i) of the first subset detector 213.

FIG. 13 is a flowchart illustrating an operating method of the first subset detector 213 and the CSB hard detector 221 of the code modulation decoder of FIG. 11. Referring to FIG. 13, in step S210, a index variable i is reset to 0. In step S220, the index variable i is increased (incremented) by one.

Step S230 is a subset detecting operation. In step S230, a subset A or a subset B may be determined according to input error-corrected MSB data B(1,i). In decision step S231, the first subset detector 213 judges whether B(1,i) is 1. If B(1,i) is 1 (YES branch of step S231), then in step S232, a subset detection result S(1,i) is judged to be a subset A. If input data is not 1 (NO branch of step S231), then in step S233, a subset detection result S(1,i) is judged to be a subset B. In the present example, since input data B(1,i) is {1, 0, 1, 1, 0, 1, 1, 1, 0}, the subset detection result S(1,i) is {A, B, A, A, B, A, A, A, B}.

In step S240 being a CSB data detecting operation, the CSB hard detector 221 determines CSB data A(2,i) according to the read result Yi and the subset detection result S(1,i). In decision step S241, in a case where it is determined to be a subset A, the CSB hard detector 221 judges whether the read result Yi is (0, 1, 2). If so (YES branch of step S241), then in step S251, the CSB data A(2,i) is judged to be 1. If not (NO branch of step S231), then in step S252, the CSB data A(2,i) is judged to be 0. In decision step S242, in a case where it is determined to be a subset B, the CSB hard detector 221 judges whether the read result Yi is (0, 1, 2, 3, 4). If so (YES branch of step S242), then in step S253, the CSB data A(2,i) is judged to be 1. If not (NO branch of step S242), then in step S254, the CSB data A(2,i) is judged to be 0.

In decision step S260, whether i is a final value (e.g., 9) is judged. If not (NO branch of step S260), the method proceeds back to step S220. If so (YES branch of step S250), the method proceeds to step S270, in which a value of {A(2,i) =1~9} is output as CSB data. In the present example, the CSB hard detector 221 outputs A(2,i)={1, 1, 0, 1, 0, 1, 1, 1, 1}.

Returning to FIG. 11, the CSB hard detector 221 outputs CSB data A(2,i) to a second ECC decoder 222. The second ECC decoder 222 may correct an error using a second parity P2 to provide error-corrected data B(2,i) to the second subset detector 223. In the case that CSB data is not erroneous, in this example, the second ECC decoder 222 outputs B(2,i)={1, 1, 0, 1, 0, 1, 1, 1, 1}. The second ECC decoder 222 removes the second parity P2 to provide a bit collector 240 with a second message MSG2 having a size of K2. In this example, the second message MSG2 is (1, 1, 0, 1, 0, 1, 1, 1).

The second subset detector 223 sequentially receives B(1, i) from a first ECC decoder 212 and B(2,i) from the second ECC decoder 222 bit by bit, and determines the second subset according to data. For example, if B(1,i)=1 and B(2,i)=1, the second subset detector 223 determines input data to be a subset C (refer to FIG. 8). The second subset detector 223 provides the subset detection result S(2,i) to an L\CSB hard detector 231. The LSB hard detector 231 outputs LSB data according to the read result Yi of the flash memory 1100 and the subset detection result S(2,i) of the second subset detector 223.

FIG. 14 is a flowchart illustrating an operating method of the second subset detector and the LSB hard detector of the code modulation decoder of FIG. 11. Referring to FIG. 14, in step S310, am index variable i is reset to 0. In step S320, the index variable i is increased (incremented) by one.

In step S330 being a subset detecting operation, one of subsets C to F is determined according to the error-corrected MSB data B(1,i) and the CSB data B(2,i). In decision step S331, the second subset detector 223 detects [B(1,i), B(2,i)]. If [B(1,i), B(2,i)] is [1,1], then in step S332, a subset detection result S(2,i) is determined to be the subset C. If [B(1,i), B(2,i)] is [1,0], then in step S333, the subset detection result S(2,i) is determined to be the subset D. If [B(1,i), B(2,i)] is [0,1], then in step S334, the subset detection result S(2,i) is determined to be the subset E. If [B(1,i), B(2,i)] is [0,0], then in step S335, the subset detection result S(2,i) is determined to be the subset F. In the present example, since B(1,i)={1, 0, 1, 1, 0, 1, 1, 1, 0} and B(2,i)={1, 1, 0, 1, 0, 1, 1, 1, 1}, the subset detection result S(2,i) is {C, E, D, C, F, C, C, C, E}.

In step S340 being an LSB data detecting operation, the LSB hard detector 231 determines LSB data A(3,i) according to the read result Yi and the subset detection result S(2,i). In case that the subset C is determined at step S330, in decision step S341, the LSB hard detector 231 judges whether the read result Yi is 0. If so (YES branch of step S341), then in step S351, LSB data A(3,i) is judged to be 1. If not (NO branch of step S341), then in step S352, LSB data A(3,i) is judged to be 0.

In case that the subset D is determined at step S330, in decision step S342, the LSB hard detector 231 judges whether the read result Yi is (0, 1, 2). If so (YES branch of step S342), then in step S353, LSB data A(3,i) is judged to be 1. If not (NO branch of step S342), in step S354, LSB data A(3,i) is judged to be 0.

In case that the subset E is determined at step S330, in decision step S343, the LSB hard detector 231 judges whether the read result Yi is (0, 1, 2, 3, 4). If so (YES branch of step S343), then in step S355, LSB data A(3,i) is judged to be 1. If not (NO branch of step S343), then in step S356, LSB data A(3,i) is judged to be 0. In case that the subset F is determined at step S330, in decision step S343, the LSB hard detector 231 judges whether the read result Yi is (0, 1, 2, 3, 4, 5, 6). If so (YES branch of step S343), then in step S357, LSB data A(3,i) is judged to be 1. If not (NO branch of step S343), then in step S358, LSB data A(3,i) is judged to be 0.

In decision step S360, whether i is a final value (e.g., 9) is judged. If not (NO branch of step S360), then the method proceeds to back to step S320. If so (YES branch of step S360), then the method proceeds to step S370, in which a value of {A(3,i); i=1~9} is output as LSB data. In the present example, the LSB hard detector 231 outputs A(3,i)={0, 0, 1, 0, 1, 1, 0, 0, 1}.

Returning to FIG. 11, the LSB hard detector 231 provide LSB data A(3,i) to the third ECC decoder 232. The third ECC decoder 232 may correct an error using a third parity P3 to output error-corrected data. The third ECC decoder 232 removes the third parity P3 to provide the bit collector 240 with a third message MSG3 having a size of K3. In the present example, the third message MSG3 is (0, 0, 1, 0, 1, 1).

A code modulation decoder 1260A according to an exemplary embodiment of the inventive concept recovers original data from code modulation data in such a manner as described above. The code modulation decoder 1260A may be applied and extended to implement a 2-bit MLC flash memory and a four- or more-bit MLC flash memory.

Figure 15:
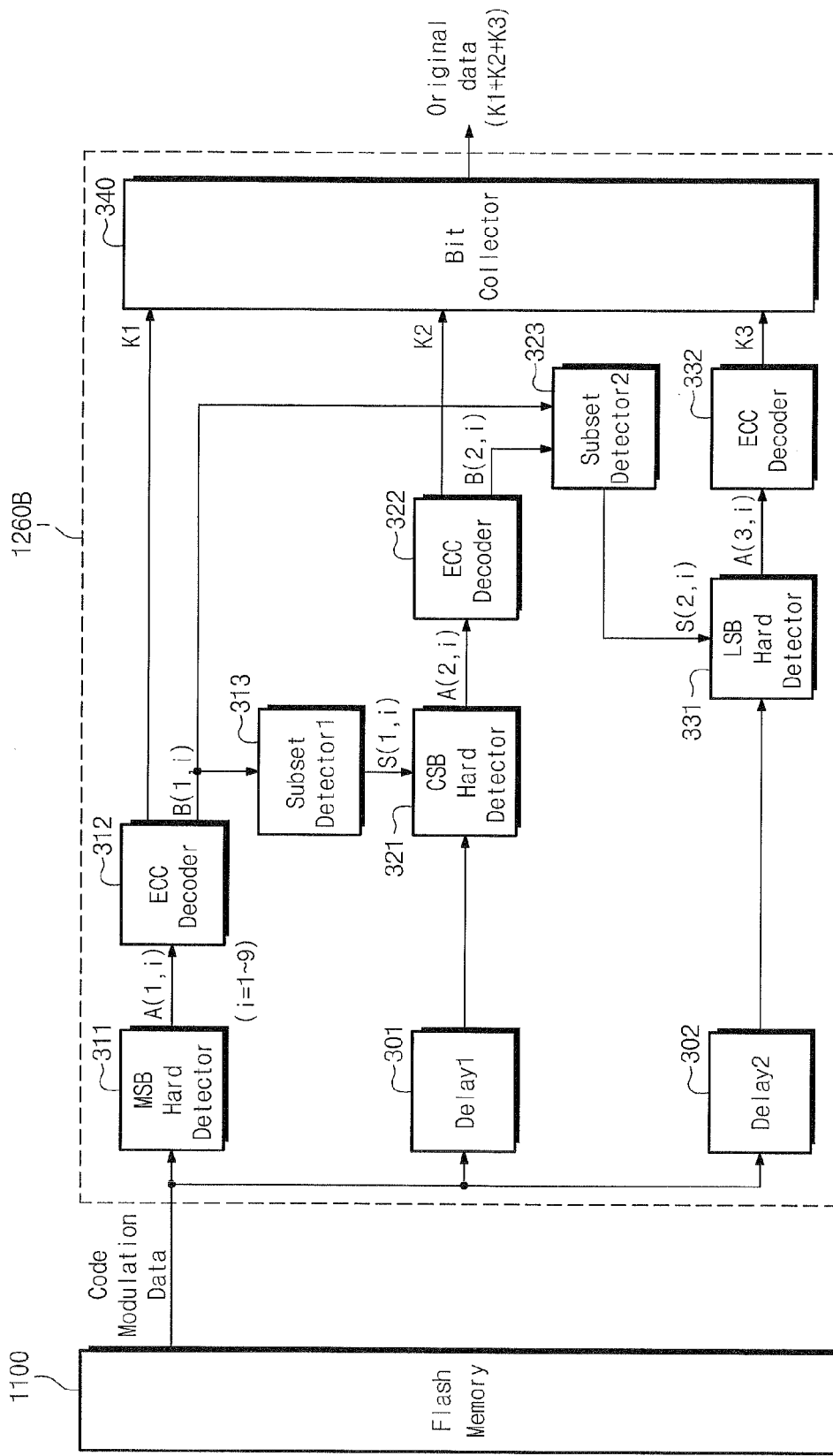
FIG. 15 is a block diagram of a code modulation decoder according to another embodiment of the inventive concept.

FIG. 15 is a block diagram of a code modulation decoder according to an embodiment of the inventive concept. Referring to FIG. 15, a code modulation decoder 1260B includes delay circuits 301 and 302, data hard detectors 311, 321, and 331, ECC decoders 312, 322, and 332, subset detectors 313 and 323, and a bit collector 340.

In FIG. 15, the ECC decoders 312, 322, and 332 have the same error correction capacity. In this case, the code modulation decoder 1260B may be designed using an ECC decoder necessitating the largest error correction capacity. The ECC decoder of the code modulation decoder 1260B may be designed the same as the third ECC decoder 232 in FIG. 11. The code modulation decoder 1260B is configured to recover original data from code modulation data stored in a flash memory 1100 in the method described with reference to FIGS. 11 to 14.

Figure 16:
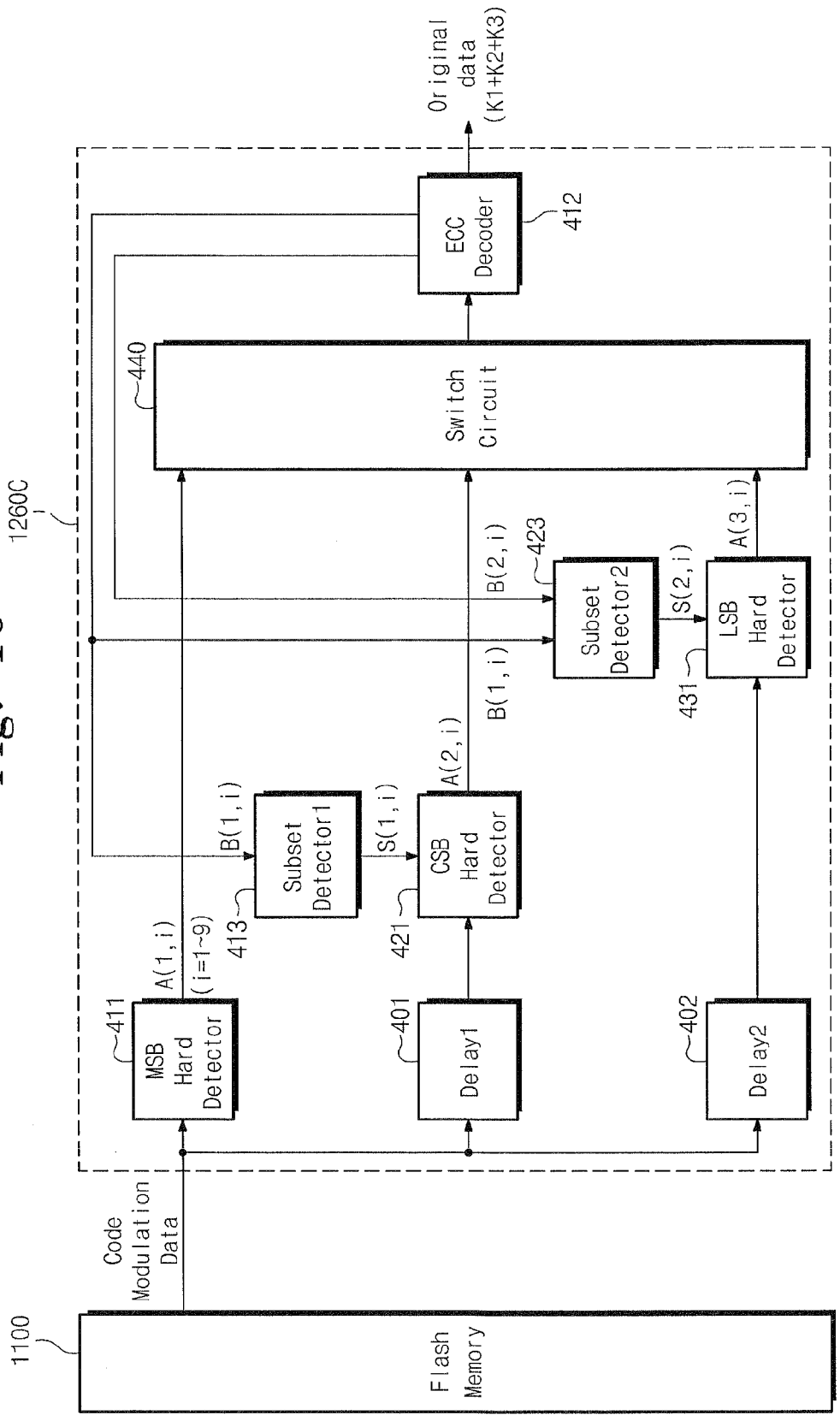
FIG. 16 is a block diagram of a code modulation decoder according to still another embodiment of the inventive concept.

FIG. 16 is a block diagram of a code modulation decoder according to an embodiment of the inventive concept. Referring to FIG. 16, the code modulation decoder 1260C includes delay circuits 401 and 402, data hard detectors 411, 421, and 431, an ECC decoder 412, subset detectors 413 and 423, and a switch circuit 440.

FIG. 16 shows the structure that the ECC decoder 412 is shared via the multiplexing switch circuit 440. Thus, the ECC decoder 412 receives MSB data A(1,i), CSB data A(2,i), and LSB data A(3,i) via the multiplexing switch circuit 440 to sequentially perform ECC decoding operations. In this case, the code modulation decoder 1260B is designed using (only) one ECC decoder necessitating the largest error correction capacity. The ECC decoder 412 may be the same as the third ECC decoder 232 in FIG. 11.

The code modulation decoder 1260C recovers original data from code modulation data stored in a flash memory 1100 in the method described with reference to FIGS. 11 to 14, however, the single ECC decoder 412 is used to perform each ECC decoding step.

Figure 17:
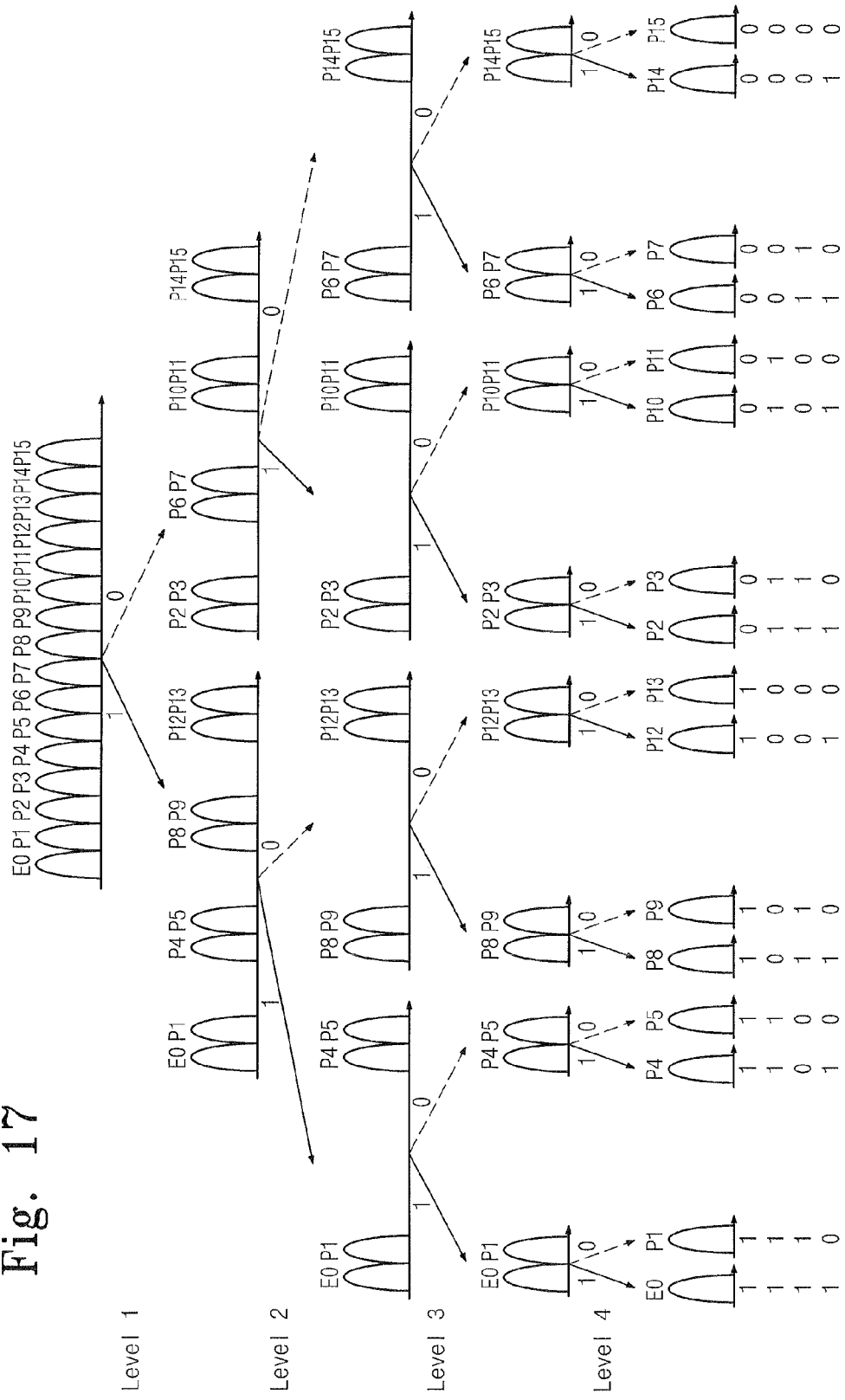
FIG. 17 is a diagram illustrating an example that a bit-state mapping method in FIG. 8 is applied to a 4-bit MLC flash memory.
Figures 18, 19:
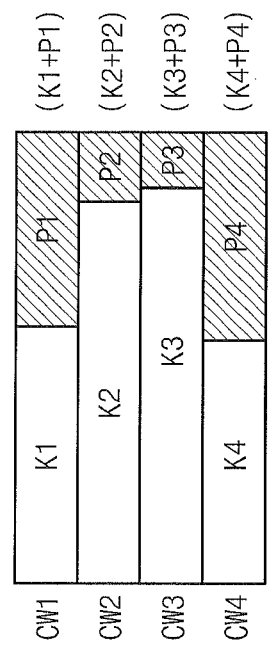
FIG. 18 is a table illustrating a bit-state mapping result illustrated in FIG. 17.
FIG. 19 is a diagram illustrating a frame structure based on a table 1.

FIG. 17 is a diagram illustrating an example that the bit-state mapping method in FIG. 8 is applied to a 4-bit MLC flash memory. FIG. 18 is a table illustrating the bit-state mapping result illustrated in FIG. 17. A 4-bit MLC flash memory may experience first to fourth levels, and adjacent states may be separated at the fourth level. With the bit-state mapping method of FIG. 17, upon recovering of original data, read operations may be performed using 15 read levels, respectively.

In case that the bit-state mapping result illustrated in FIG. 17 is used and a BCH code is used as a component ECC, the reliability must be analyzed to determine a parameter of a BCH code at every level. If an uncorrectable bit error rate (UBER) is used as a standard for measuring the reliability, a parameter of a BCH code capable of minimizing a total UBER may be determined at every level. Selection of a decoding algorithm may be needed to calculate the UBER (or, other reliability standards).

As an exemplary decoding algorithm, a multi-stage decoding algorithm capable of being actually implemented may be selected from among those known by persons skilled in the art. The multi-stage decoding method may include performing ECC decoding at an (i)th level and performing with respect to a (i+1)th level based on an error correction result, obtained by the ECC decoding performed at the (i)th level, and an input signal. This procedure may be performed with respect to all levels.

When the multi-stage decoding method is used, the UBER may be expressed by the following equation 1:

$$P_U(E) = \frac{P_F(E)}{k}$$ [Equation 1]

$$= \frac{1 - Pr(S_1, S_2, \ldots, S_m)}{k}$$

$$= \frac{1 - \prod_{i=1}^{m} Pr(S_i | S_1, S_2, \ldots, S_{i-1})}{k}$$

$$= \frac{1 - \prod_{i=1}^{m} (1 - Pr(F_i | S_1, S_2, \ldots, S_{i-1}))}{k}$$

In equation 1, k indicates the number of information bits. Fi indicates an ECC decoding fail event at an (i)th level. Si indicates an ECC decoding success event at an (i)th level. When a BCH code is used as each component code and bounded distance decoding is performed like a Berlekamp-Massey algorithm, the probability that ECC decoding is passed until a (i−1)th level and is failed at an (i)th level may be calculated by the following equation 2:

$$Pr(F_i | S_1, S_2, \ldots, S_{i-1}) = \sum_{k=t_i+1}^{n} \binom{n}{k} p_i^k (1 - p_i)^{n-k}$$ [Equation 2]

In equation 2, n is the length of a code word, and may be identical with respect to all levels. $t_i$ indicates an error correction capacity of a BCH code used at an (i)th level. Pi is a raw BER at an (i)th level, may indicates a raw BER under the condition that ECC decoding is passed until a (i−1)th level. In this example, when an AWGN channel is applied to a 4-bit MLC flash memory, raw BER of each level may be as follows:

At a first level, raw BER may be expressed by the following equation 3:

$$p_1 = \frac{7}{8} Q\left(\frac{d}{\sigma}\right)$$ [Equation 3]

At a second level, raw BER may be expressed by the following equation 4:

$$p_2 = \frac{3}{4} Q\left(\frac{3d}{\sigma}\right)$$ [Equation 4]

At a third level, raw BER may be expressed by the following equation 5:

$$p_3 = \frac{3}{4} Q\left(\frac{7d}{\sigma}\right)$$ [Equation 5]

At a third level, raw BER may be expressed by the following equation 6:

$$p_4 = Q\left(\frac{d}{\sigma}\right)$$ [Equation 6]

In equations 3 to 6, 'd' corresponds to a minimum value among Euclidean distances between centers of two adjacent states, and σ indicates a standard deviation of noise. The following table 1 show parameters of BCH codes capable of minimizing UBER with respect to a 4-bit MLC flash memory according to the equations 3 to 6.

TABLE 1

| Level | Information bit length | Error correcting capability | Codeword length |
|---|---|---|---|
| 1 | 7401 | 121 | 9088 |
| 2 | 9074 | 1 | 9088 |
| 3 | 9074 | 1 | 9088 |
| 4 | 7219 | 136 | 9088 |

FIG. 19 is a diagram illustrating a frame structure based on a table 1. The frame structure in FIG. 19 is obtained under the condition that the cell overhead is 11% and the total information bit length is 4 KB, and may correspond to the case that information bit size is 1 KB per page.

Figure 20:
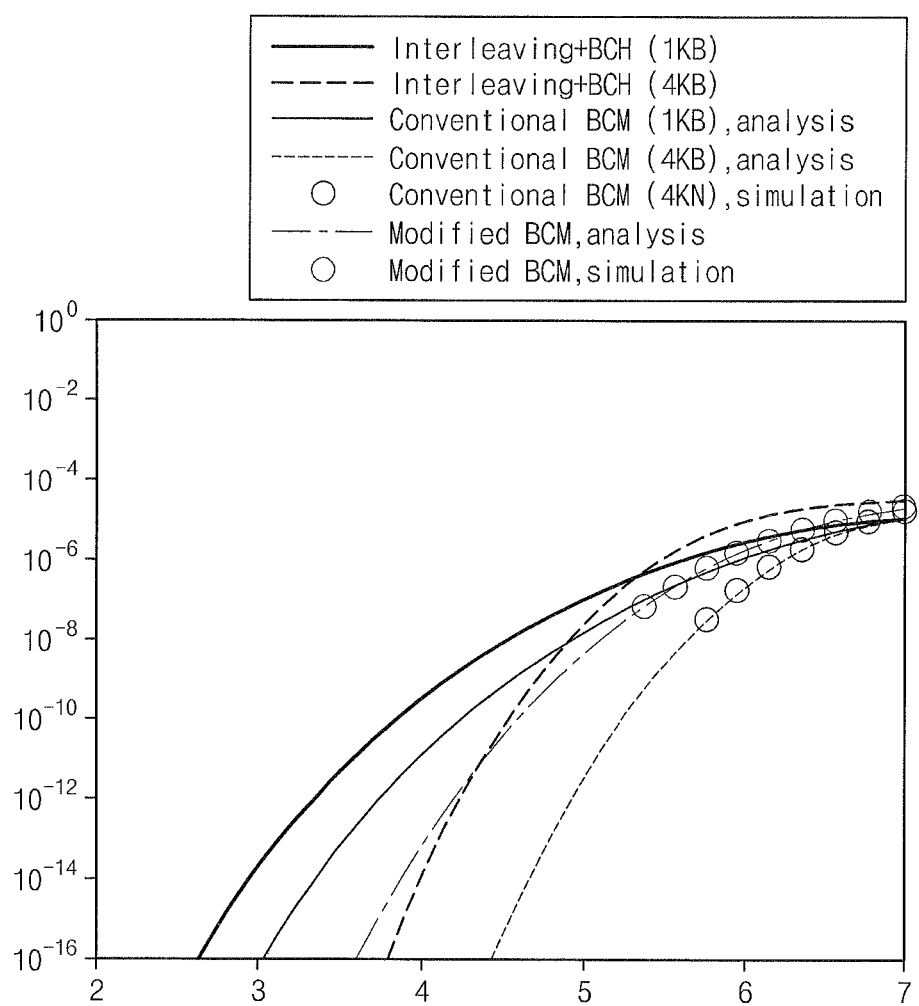
FIG. 20 is a graph illustrating a result obtained by calculating UBER theoretically according to a given raw BER.

FIG. 20 is a graph illustrating a result obtained by calculating UBER theoretically according to a given raw BER. In FIG. 20, BCM is an abbreviation for block coded modulation, and a BCH code may be used as a component code. Being a type of block code, the BCH code may be marked by BCM. A result analyzed according to the equation 2 shows that a simulation result is well predicted. Compared with a conventional method, UBER may be improved over at least 105 on the basis of raw BER $3.6×10^{-3}$. Also, it is understood that it is approximate to the reliability when 4 KB BCH code of the same cell overhead is used.

A memory system according to an embodiment of the inventive concept may be applied to various products. The memory system according to an embodiment of the inventive concept may be used as not only in electronic devices such as a personal computer, a digital camera, a camcorder, a portable telephone, an MP3 player, a PMP, a PSP, a PDA, and the like but also in storage devices such as a memory card, an USB memory, a solid state drive (SSD), and the like.

Figure 21:
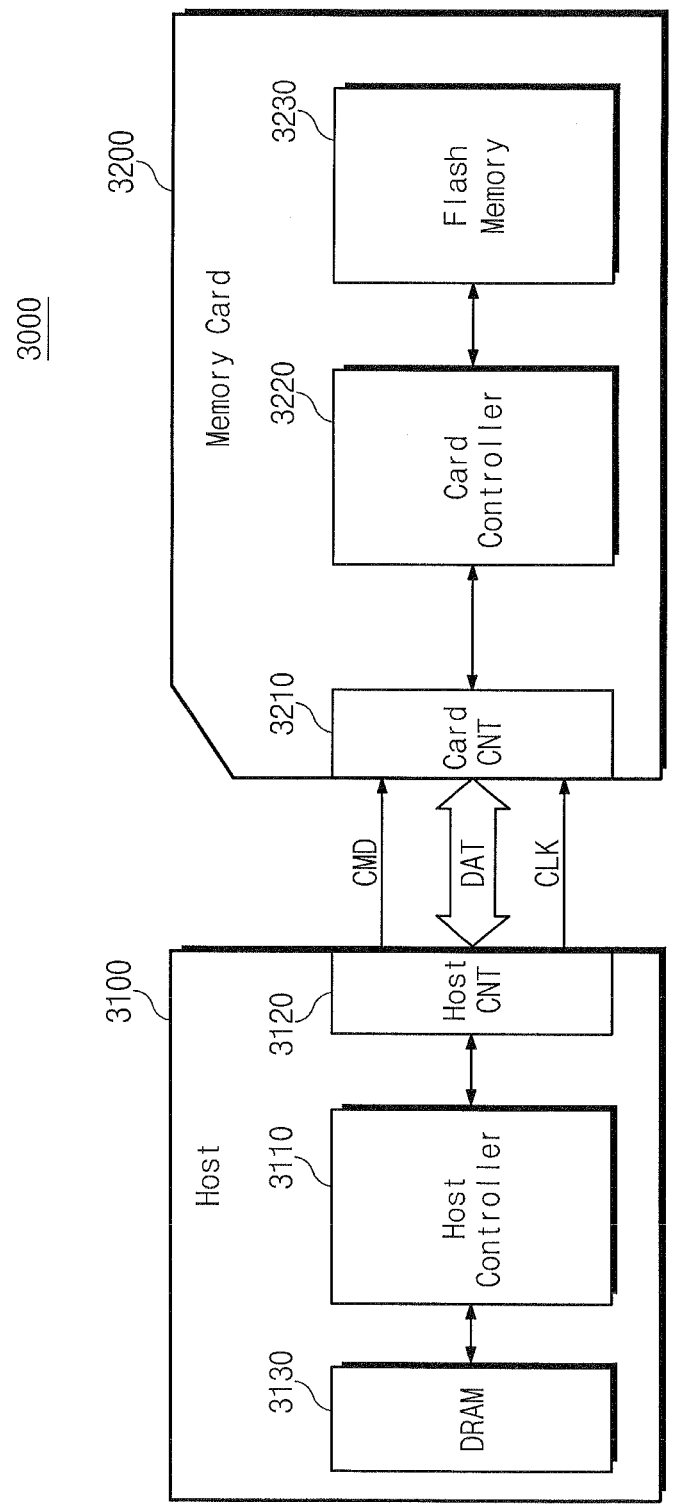
FIG. 21 is a block diagram of a memory card including a flash memory system according to an embodiment of the inventive concept.

FIG. 21 is a block diagram of a memory card including a flash memory system according to an exemplary embodiment of the inventive concept. A memory card system 3000 includes a host 3100 and a memory card 3200. The host 3100 may include a host controller 3110, a host connection unit 3120, and a DRAM 3130.

The host 3100 can write data to the memory card 3200 and can read data from the memory card 3200. The host controller 3110 can send a command (e.g., a write command), a clock signal CLK generated from a clock generator (not shown) in the host 3100, and data to the memory card 3200 via the host connection unit 3120. The DRAM 3130 can be a main (system) memory of the host 3100.

The memory card 3200 includes a card connection unit 3210, a card controller 3220, and a flash memory 3230. The card controller 3220 stores (writes) data into the flash memory 3230 in response to a write command input via the card connection unit 3210. The data may be stored in synchronization with a clock signal generated from a clock generator (not shown) in the card controller 3220. The flash memory 3230 can store data transferred from the host 3100. For example, in a case where the host 3100 is a digital camera, the flash memory 3230 may store image data.

In the memory card system 3000 in FIG. 21, the card controller 3220 includes a code modulation encoder (1250, refer to FIG. 1) and a code modulation decoder (1260, refer to FIG. 1). Through the above-described bit-state mapping method, the memory card system 3000 according to an embodiment of the inventive concept can maintain the reliability of data while reducing the number of read operations. ECC encoder and decoder may be efficiently designed in light of the error correction capacities of the ECC encoder and decoder.

Figure 22:
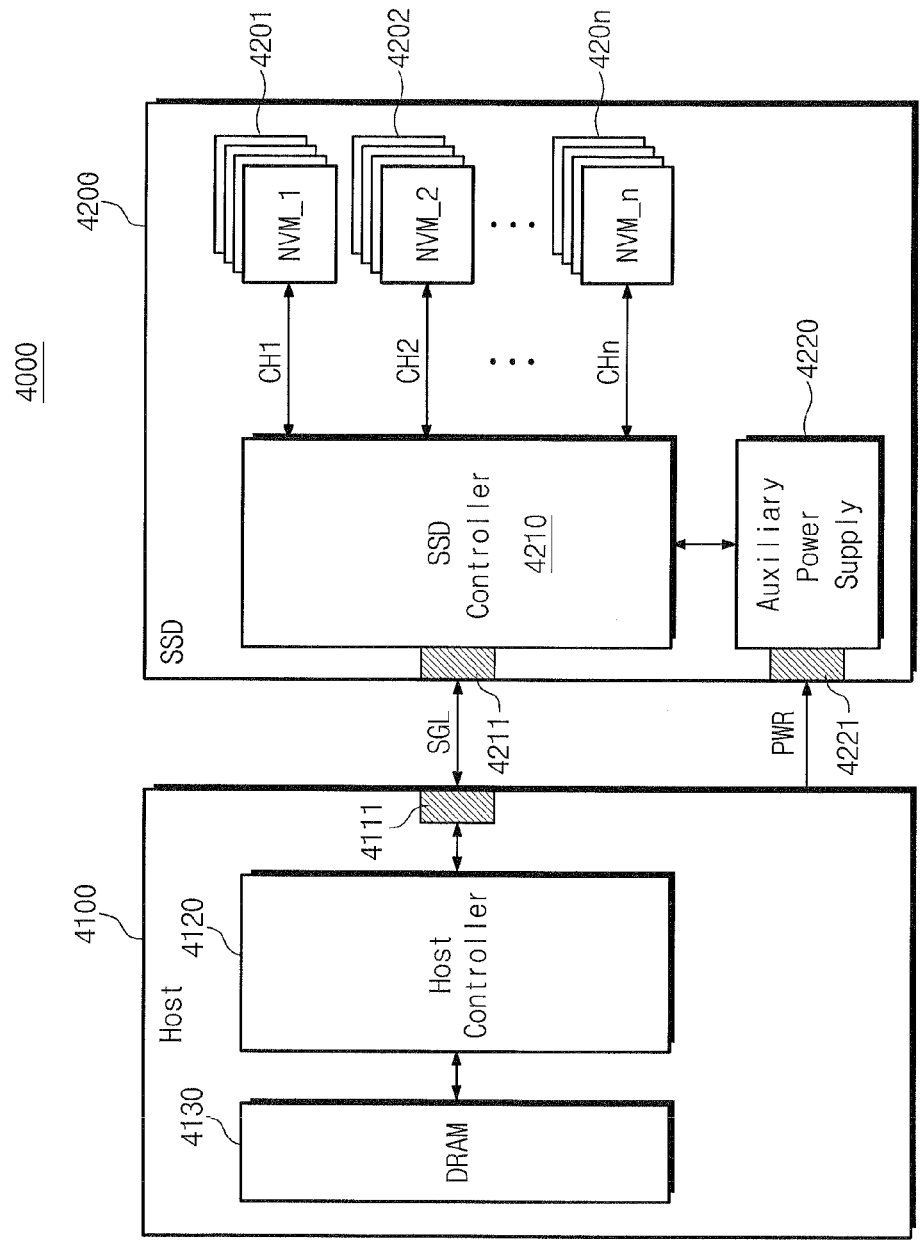
FIG. 22 is a block diagram illustrating a solid state drive system in which a memory system according to the inventive concept is applied.

FIG. 22 is a block diagram of a solid state drive system in which a memory system according to the inventive concept is applied. Referring to FIG. 22, a solid state drive (SSD) system 4000 includes a host 4100 and an SSD 4200. The host 4100 includes a host interface 4111; a host controller 4120, and a DRAM 4130.

The host 4100 can write data in the SSD 4200 or read data from the SSD 4100. The host controller 4120 can transfer signals SGL such as a command, an address, a control signal, and the like to the SSD 4200 via the host interface 4111. The DRAM 4130 may be a main (system) memory of the host 4100.

The SSD 4200 can exchange signals SGL with the host 4100 via the host interface 4111, and may be supplied with a power via a power connector 4221. The SSD 4200 may include a plurality of nonvolatile memories 4201 to 420n, an SSD controller 4210, and an auxiliary power supply 4220. Herein, the nonvolatile memories 4201 to 420n can be implemented by not only a NAND flash memory but also nonvolatile memories such as PRAM, MRAM, ReRAM, and the like.

The plurality of nonvolatile memories 4201 to 420n can be used as a storage medium of the SSD 4200. The plurality of nonvolatile memories 4201 to 420n may be connected with the SSD controller 4210 via a plurality of channels CH1 to CHn. One channel may be connected with one or more nonvolatile memories. Nonvolatile memories connected with one channel may be connected with the same data bus.

The SSD controller 4210 can exchange signals SGL with the host 4100 via the host interface 4211. Herein, the signals SGL may include a command, an address, data, and the like. The SSD controller 4210 may be configured to write or read out data to or from a corresponding nonvolatile memory according to a command of the host 4100. The SSD controller 4210 will be more fully described with reference to FIG. 23.

The auxiliary power supply 4220 may be connected with the host 4100 via the power connector 4221. The auxiliary power supply 4220 may be charged by a power PWR from the host 4100. The auxiliary power supply 4220 may be placed inside or outside the SSD 4200. For example, the auxiliary power supply 4220 may be put on a main board to supply the auxiliary power to the SSD 4200.

Figure 23:
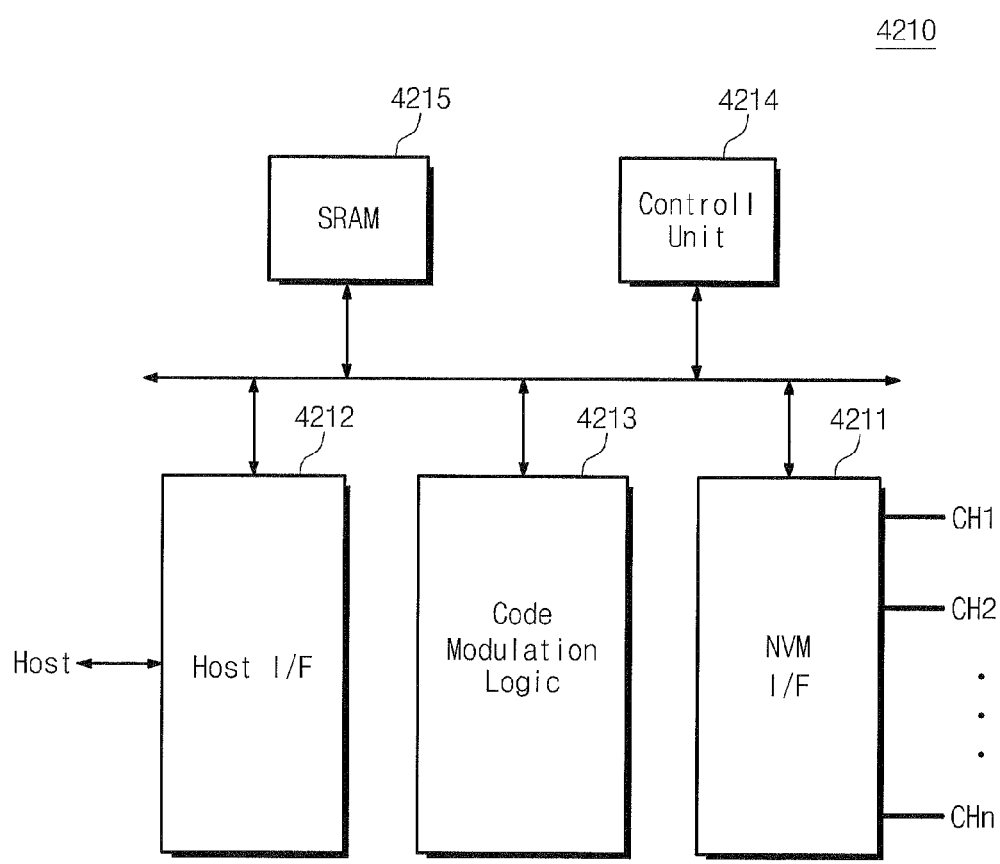
FIG. 23 is a block diagram of the SSD controller in the solid state drive system of FIG. 22.

FIG. 23 is a block diagram schematically illustrating the SSD controller in the solid state drive system of FIG. 22. Referring to FIG. 23, the SSD controller 4210 includes an NVM interface 4211, a host interface 4212, code modulation logic 4213, a control unit 4214, and an SRAM 4215.

The NVM interface 4211 distributes data transferred from a main memory of a host 4100 to channels CH1 to CHn, respectively. The NVM interface 4211 transfers data read from nonvolatile memories 4201 to 420n to the host 4100 via the host interface 4212.

The host interface 4212 provides an interface with an SSD 4200 according to the protocol of the host 4100. The host interface 4212 can communicate with the host 4100 using USB (Universal Serial Bus), SCSI (Small Computer System Interface), PCI express, ATA, PATA (Parallel ATA), SATA (Serial ATA), SAS (Serial Attached SCSI), etc. The host interface 4212 can perform a disk emulation function which enables the host 4100 to recognize the SSD 4200 as a hard disk drive (HDD).

The code modulation logic 4213 includes a code modulation encoder 1250 and a code modulation decoder 1260 described with reference to FIG. 1. The control unit 4214 analyzes and processes a signal SGL input from the host 4100. The control unit 4214 controls the host 4100 or the nonvolatile memories 4201 to 420n via the host interface 4212 or the NVM interface 4211. The control unit 4214 may control the nonvolatile memories 4201 to 420n according to firmware for driving the SSD 4200.

The SRAM 4215 may be used to drive software that efficiently manages the nonvolatile memories 4201 to 420n. The SRAM 4215 may store metadata input from a main memory of the host 4100 or cache data. At a sudden power-off operation, metadata or cache data stored in the SRAM 4215 may be stored in the nonvolatile memories 4201 to 420n using an auxiliary power supply 4220.

The SSD system 4000 in FIG. 22 may make code modulation on original data or recover original data from code modulation data using a code modulation encoder and a code modulation decoder. The inventive concept may reduce the number of read operations while maintaining the reliability of data. ECC encoder and decoder may be efficiently designed in light of error correction capacities of the ECC encoder and decoder.

Figure 24:
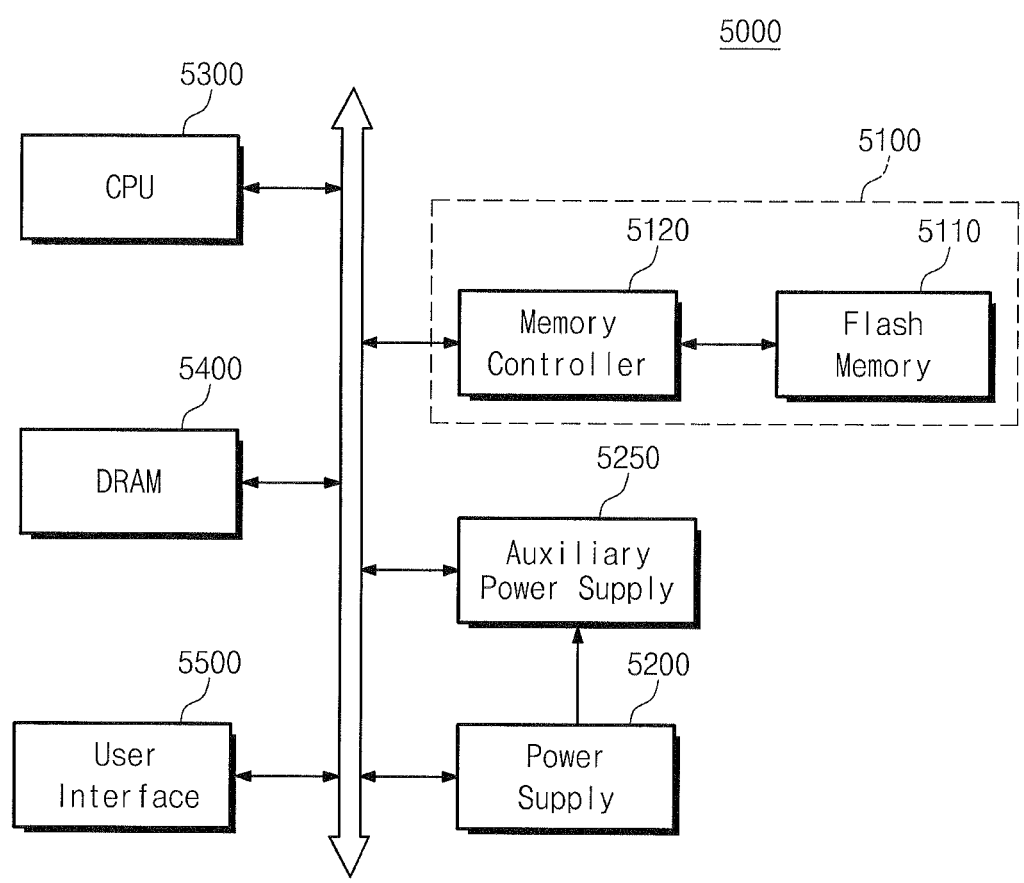
FIG. 24 is a block diagram of an electronic device including a flash memory system according to an embodiment of the inventive concept.

FIG. 24 is a block diagram of an electronic device including a flash memory system according to an exemplary embodiment of the inventive concept. Herein, an electronic device 5000 may be a personal computer or a handheld electronic device such as a notebook computer, a cellular phone, a PDA, a camera, and the like.

Referring to FIG. 24, the electronic device 5000 includes a memory system 5100, a power supply device 5200, an auxiliary power supply 5250, a CPU 5300, a DRAM 5400, and a user interface 5500. The memory system 5100 includes a flash memory 5110 and a memory controller 5120. The memory system 5100 can be embedded within the electronic device 5000.

The electronic device 5000 in FIG. 23 may make code modulation on original data or recover original data from code modulation data using a code modulation encoder and a code modulation decoder. The inventive concept can reduce the read number over maintaining the reliability of data. The ECC encoder and decoder may be efficiently designed in light of error correction capacities of the ECC encoder and decoder.

A memory system according to an embodiment of the inventive concept is applicable to a flash memory having a three-dimensional structure as well as a flash memory having a two-dimensional structure.

Figure 25:
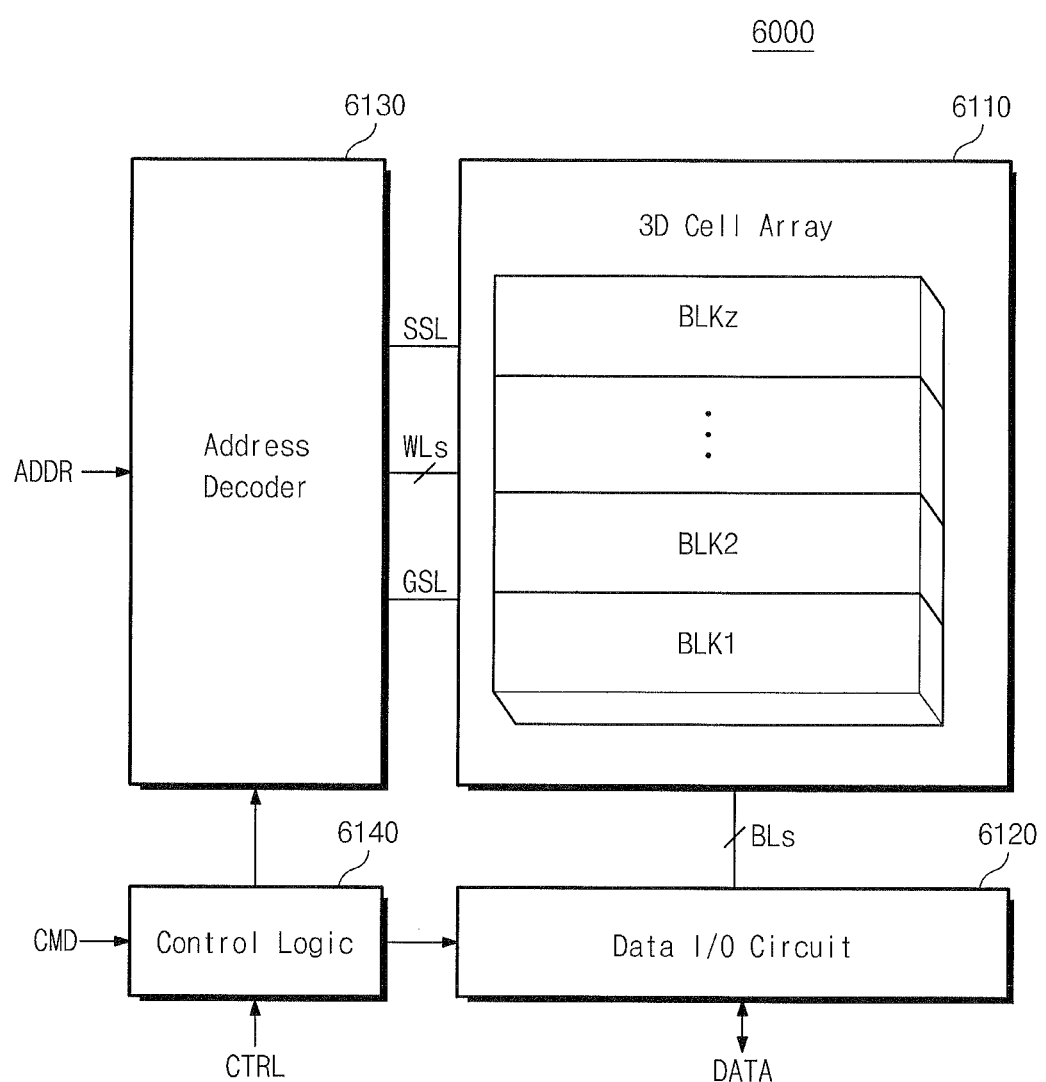
FIG. 25 is a block diagram of a flash memory applied to the inventive concept.

FIG. 25 is a block diagram of a flash memory applied to the inventive concept. Referring to FIG. 25, a flash memory 6000 includes a three-dimensional (3D) cell array 6110, a data input/output circuit 6120, an address decoder 6130, and control logic 6140.

The 3D cell array 6110 includes a plurality of memory blocks BLK1 to BLKz, each of which is formed to have a three-dimensional structure (or, a vertical structure). For a memory block having a two-dimensional (horizontal) structure, memory cells may be formed in a direction horizontal to a substrate. For a memory block having a three-dimensional structure, memory cells may be formed in a direction perpendicular to the substrate. Each memory block may be an erase unit of the flash memory 6000.

The data input/output circuit 6120 may be connected with the 3D cell array 6110 via a plurality of bit lines. The data input/output circuit 6120 receives data from an external device or output data read from the 3D cell array 6110 to the external device. The address decoder 6130 may be connected with the 3D cell array 6110 via a plurality of word lines and selection lines GSL and SSL. The address decoder 6130 selects the currently active word lines in response to an address ADDR.

The control logic 6140 controls programming (writing), erasing, reading, etc. of the flash memory 6000. For example, at programming, the control logic 6140 controls the address decoder 6130 such that a program voltage is supplied to a selected word line, and controls the data input/output circuit 6120 such that data is programmed.

Figure 26:
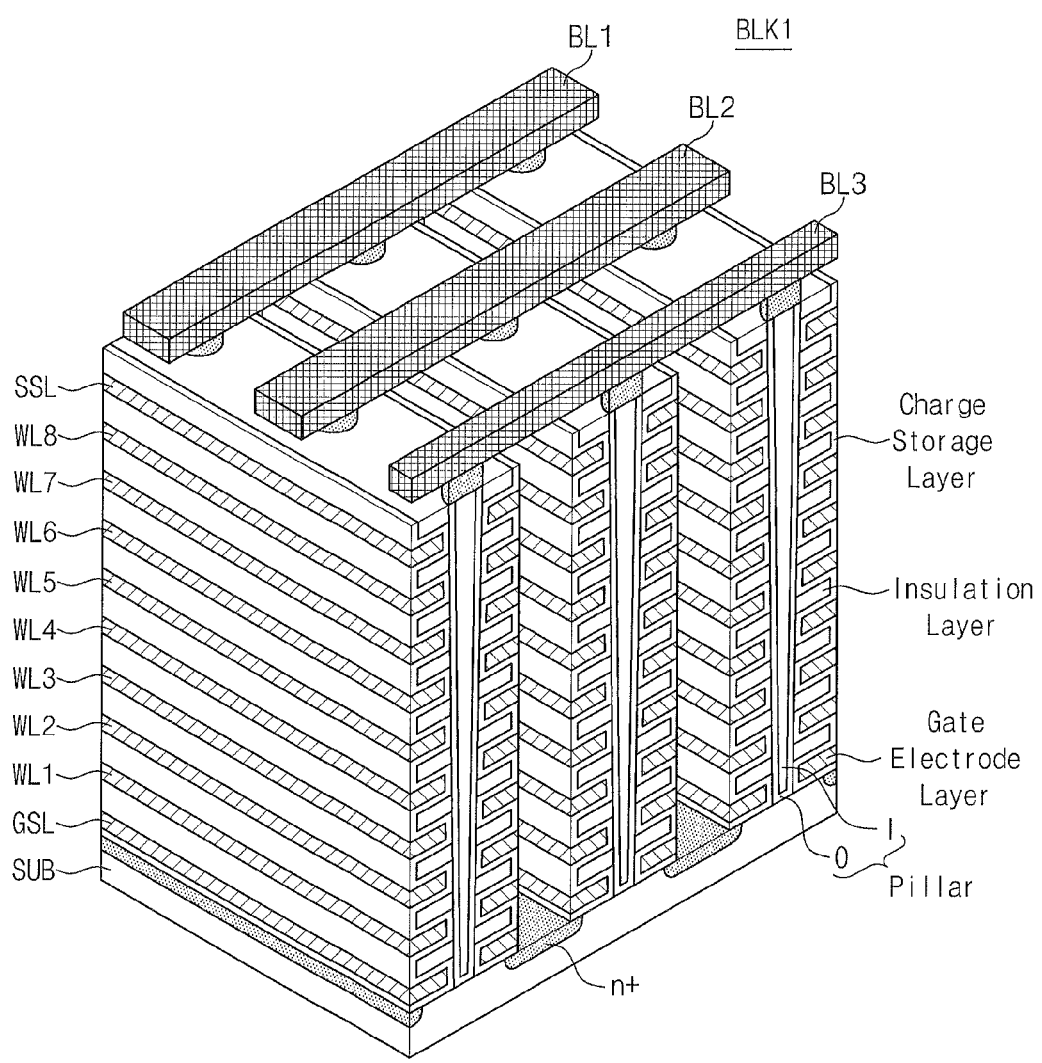
FIG. 26 is a perspective view schematically illustrating 3D structure of the memory block illustrated in FIG. 25.

FIG. 26 is a perspective view schematically illustrating the 3D structure of the memory block illustrated in FIG. 25. Referring to FIG. 26, the memory block BLK1 is formed in a direction perpendicular to a substrate SUB. An n+ doping region is be formed in the substrate SUB. A plurality of gate electrode layers and insulation layers are alternately deposited on the substrate SUB. A charge storage layer may be formed vertically between the gate electrode layer and a channel formed in a V-shaped pillar.

If the gate electrode layer and the insulation layer are patterned in a vertical direction, a V-shaped pillar may be formed. The pillar may be connected with the substrate SUB. An outer portion O of the pillar may be formed of a channel semiconductor, and an inner portion I thereof may be formed of an insulation material such as silicon oxide.

The gate electrode layers of the memory block BLK1 are connected with a ground selection line GSL, a plurality of word lines WL1 to WL8, and a string selection line SSL. Each pillar of the memory block BLK1 may be connected with a bit line among a plurality of bit lines BL1 to BL3. In FIG. 23, there is illustrated the case that memory block BLK1 has eight word lines WL1 to WL8, and three bit lines BL1 to BL3. However, the inventive concept is not limited thereto.

Figure 27:
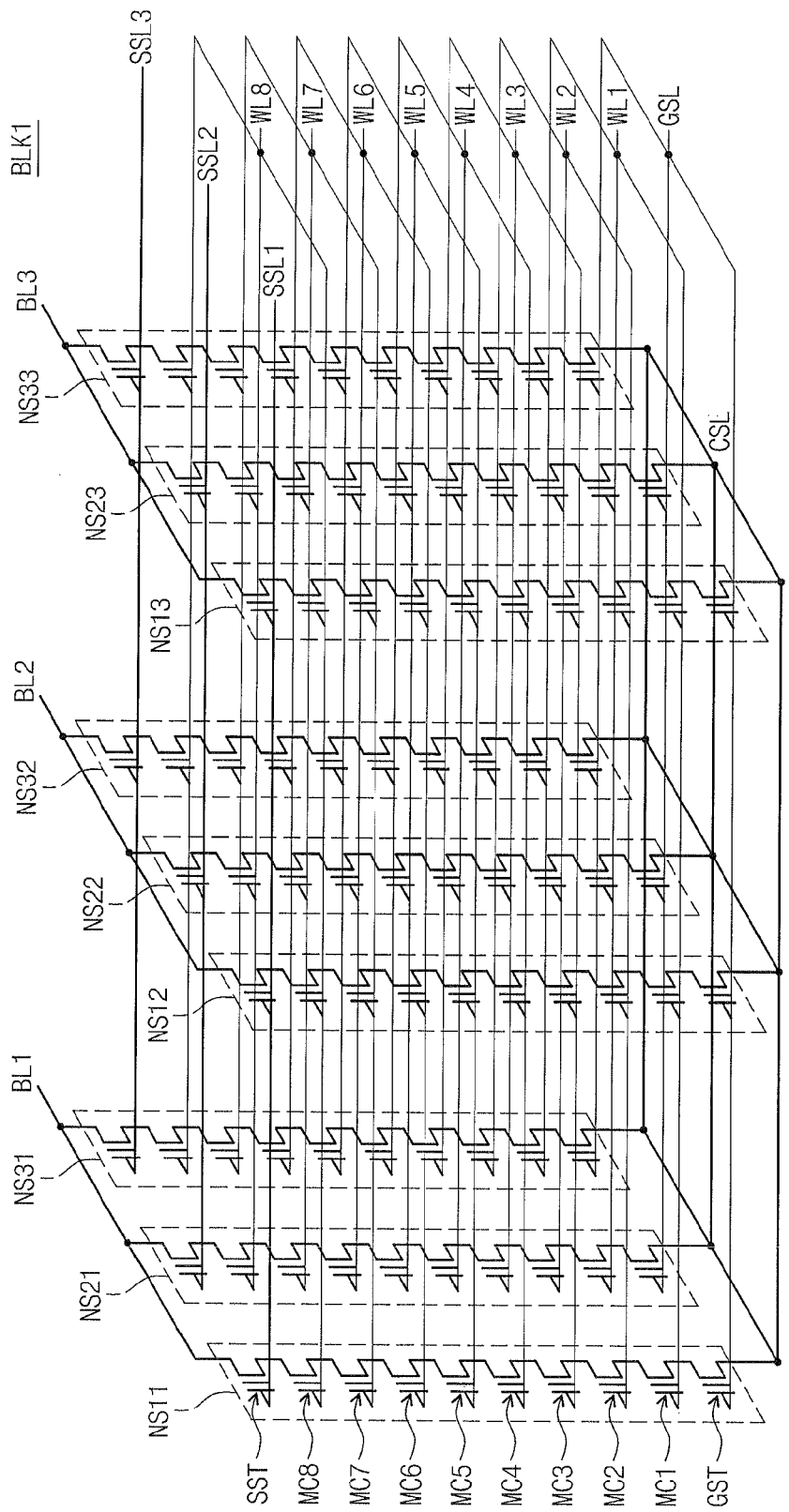
FIG. 27 is a circuit diagram schematically illustrating an equivalent circuit of the memory block illustrated in FIG. 26.

FIG. 27 is a circuit diagram schematically illustrating an equivalent circuit of the memory block illustrated in FIG. 26. Referring to FIG. 27, NAND strings NS11 to NS33 are connected between bit lines BL1 to BL3 and a common source line CSL. Each NAND string (e.g., NS11) includes a string selection transistor SST, a plurality of memory cells MC1 to MC8, and a ground selection transistor GST.

The string selection transistors SST are connected with string selection lines SSL1 to SSL3. The memory cells MC1 to MC8 are connected with corresponding word lines WL1 to WL8, respectively. The ground selection transistors GST are connected with ground selection line GSL. A string selection transistor SST is connected with each bit line, and every ground selection transistor GST is connected with the common source line CSL.

Word lines (e.g., WL1) having the same height may be connected in common, and the string selection lines SSL1 to SSL3 may be separated from one another. At programming of memory cells (constituting a page) connected with a first word line WL1 and included in NAND strings NS11, NS12, and NS13, there may be selected a first word line WL1 and a first string selection line SSL1.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A code modulation decoder for a flash memory system, the code modulation decoder comprising:
   a first hard detector configured to receive code-modulated data stored in a plurality of memory cells of a flash memory system and detect a first code word corresponding to a first data significant level from the code-modulated data;
   a first error correction code (ECC) decoder configured to correct an error of the detected first code word to form an error-corrected first code word and remove first parities from the error-corrected first code word to generate a first bit vector;
   a first subset selector configured to detect a first level subset based on the error-corrected first code word; and
   a second hard detector configured to receive the code-modulated data and detect a second code word corresponding to a second data significant level from the code-modulated data based on the first level subset.

2. The code modulation decoder of claim 1 wherein each of the plurality of memory cells has one of a plurality of states, the plurality of states includes an erase state and at least one program state, and the first level subset is a subset of parts of the plurality of states.

3. The code modulation decoder of claim 1, further comprising:
- a delay circuit configured to provide the code-modulated data to the second hard detector after a delay time elapses from when the code-modulated data is provided to the first hard detector.

4. The code modulation decoder of claim 1, further comprising:
- a second error correction code (ECC) decoder configured to correct an error of the detected second code word and remove second parities from the error-corrected second code word to generate a second bit vector.

5. The code modulation decoder of claim 4, wherein error correction capacities of the first and second ECC decoders are different from each other.

6. The code modulation decode of claim 4, further comprising:
- a second subset detector configured to detect a second level subset based on the error-corrected first and second code words;
- a third hard detector configured to receive the code-modulated data and detect a third code word corresponding to second data significant level from the code-modulated data based on the second code word; and
- a third error correction code (ECC) decoder configured to correct an error of the detected third code word, remove third parities from the error-corrected third code word to generate a third bit vector.

7. The code modulation decoder of claim 6, further comprising:
- a delay circuit configured to provide the code-modulated data to the third hard detector after a delay time elapses from when the code-modulated data is provided to the first hard detector.

8. The code modulation decode of claim 6, further comprising:
- a bit collector configured to receive the first to third bit vectors from the first to third ECC decoders, respectively, to output original data.

9. The code modulation decode of claim 6, wherein the first to third parities have different sizes from each other.

10. The code modulation decoder of claim 1 comprised by a memory controller, the memory controller further comprising:
- a code modulation encoder configured to generate code-modulated data based on original data and store the code-modulated data in a plurality of memory cells, each of the plurality of memory cells having one of a plurality of states,
- wherein the code modulation decoder is configured to receive the code-modulated data from a plurality of memory cells and recover the original data based on the received code-modulated data.

11. The memory controller of claim 10 comprised by a data storage device, the data storage device further comprising:
- a flash memory circuit configured to store at least one-bit data in each of a plurality of memory cells, each of the plurality of memory cells having one of a plurality of states, the plurality of states including an erase state and at least one program state, and the first level subset being a subset of parts of the plurality of states,
- wherein the memory controller is configured to control the flash memory circuit.

* * * * *